(12) United States Patent
Rhee et al.

(10) Patent No.: US 7,301,168 B2
(45) Date of Patent: Nov. 27, 2007

(54) ORGANIC LIGHT EMITTING DIODE DISPLAY AND MANUFACTURING METHOD WITH PARTITION AND EMISSION REGIONS TO IMPROVE EMISSION CHARACTERISTICS

(75) Inventors: Jung-Soo Rhee, Seoul (KR); Jianpu Wang, Yongin-si (KR); Song-Mi Hong, Hwaseong-si (KR); Dong-Won Lee, Seongnam-si (KR); Jin-Koo Chung, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/240,354

(22) Filed: Oct. 3, 2005

(65) Prior Publication Data

US 2006/0197086 A1    Sep. 7, 2006

(30) Foreign Application Priority Data

Mar. 4, 2005    (KR) ............... 10-2005-0018113

(51) Int. Cl.
*H01L 51/00*    (2006.01)
(52) U.S. Cl. .................. 257/40; 257/E51.018
(58) Field of Classification Search ............ None
See application file for complete search history.

(56) References Cited

U.S. PATENT DOCUMENTS 6,150,668 A * 11/2000 Bao et al. ............ 257/40

2002/0031874 A1 * 3/2002 Yamazaki et al. ........ 438/156
2003/0190819 A1 * 10/2003 Chang et al. ........... 438/760

FOREIGN PATENT DOCUMENTS

| JP | 11-087062 | 3/1999 |
|----|-----------|--------|
| JP | 11-271753 | 10/1999 |
| JP | 11-329741 | 11/1999 |
| JP | 2001-291583 | 10/2001 |
| JP | 2001-345178 | 12/2001 |
| JP | 2002-216955 | 8/2002 |
| JP | 2002-305077 | 10/2002 |
| JP | 2003-007460 | 1/2003 |
| JP | 2003-092188 | 3/2003 |
| JP | 2003-163084 | 6/2003 |

(Continued)

OTHER PUBLICATIONS

English Language Abstract, JP Patent Publication No. 11-087062, Mar. 3, 1999, 1 page.

(Continued)

*Primary Examiner*—Leonardo Andujar
*Assistant Examiner*—Kevin Quinto
(74) *Attorney, Agent, or Firm*—MacPherson Kwok Chen & Heid LLP

(57) ABSTRACT

An organic light emitting display according to an embodiment of the invention includes: a substrate; a first electrode disposed on the substrate; a first partition disposed on the first electrode and having an opening exposing the first electrode; a second partition that is disposed on the first partition, wider than the first partition, defines an emission area, and includes photosensitive organic material; an emission layer disposed in the emission area; and a second electrode disposed on the emission layer.

19 Claims, 30 Drawing Sheets

FOREIGN PATENT DOCUMENTS

| | | |
|---|---|---|
| JP | 2003-229267 | 8/2003 |
| JP | 2003-272871 | 9/2003 |
| JP | 2004-071432 | 3/2004 |
| JP | 2004-171007 | 6/2004 |
| KR | 10-0209657 | 4/1999 |
| KR | 10-0304880 | 7/2001 |
| KR | 10-2002-0049877 | 6/2002 |
| KR | 10-2002-0080759 | 10/2002 |
| KR | 10-2002-0090573 | 12/2002 |
| KR | 10-2003-0058151 | 7/2003 |
| KR | 10-2004-0020783 | 3/2004 |
| KR | 10-2004-0051072 | 6/2004 |
| KR | 10-0437533 | 6/2004 |
| KR | 10-2004-0058845 | 7/2004 |

OTHER PUBLICATIONS

English Language Abstract, JP Patent Publication No. 11-271753, Oct. 8, 1999, 1 page.
English Language Abstract, JP Patent Publication No. 11-329741, Nov. 30, 1999, 1 page.
English Language Abstract, JP Patent Publication No. 2001-291583, Oct. 19, 2001, 1 page.
English Language Abstract, JP Patent Publication No. 2001-345178, Dec. 14, 2001, 1 page.
English Language Abstract, JP Patent Publication No. 2002-216955, Aug. 5, 2002, 1 page.
English Language Abstract, JP Patent Publication No. 2002-305077, Oct. 18, 2002, 1 page.
English Language Abstract, JP Patent Publication No. 2003-007460, Jan. 10, 2003, 1 page.
English Language Abstract, JP Patent Publication No. 2003-092188, Mar. 28, 2003, 1 page.
English Language Abstract, JP Patent Publication No. 2003-163084, Jun. 6, 2003, 1 page.
English Language Abstract, JP Patent Publication No. 2003-229267, Aug. 15, 2003, 1 page.
English Language Abstract, JP Patent Publication No. 2003-272871, Sept. 26, 2003, 1 page.
English Language Abstract, JP Patent First Publication No. 2004-071432, Mar. 4, 2004, 1 page.
English Language Abstract, JP Patent First Publication No. 2004-171007, Jun. 17, 2004, 1 page.
English Language Abstract, JP Patent First Publication No. 10-0209657, Apr. 22, 1999, 1 page.
English Language Abstract, KR Patent Publication No. 10-0304880, Jul. 25, 2001, 1 page.
English Language Abstract, KR Patent Publication No. 10-2002-0049877, Jun. 2, 2002, 1 page.
English Language Abstract, KR Patent Publication No. 10-2002-0080759, Oct. 26, 2002, 1 page.
English Language Abstract, KR Patent First Publication No. 10-2002-0090573, Dec. 5, 2002, 1 page.
English Language Abstract, KR Patent First Publication No. 10-2003-0058151, Jul. 7, 2003, 1 page.
English Language Abstract, KR Patent First Publication No. 10-2004-0020783, Mar. 9, 2004, 1 page.
English Language Abstract, KR Patent First Publication No. 10-0437533, Jun. 16, 2004, 1 page.
English Language Abstract, KR Patent First Publication No. 10-2004-0051072, Ju. 18, 2004, 1 page.
English Language Abstract, KR Patent First Publication No. 10-2004-0058845, Jul. 5, 2004, 1 page.

* cited by examiner

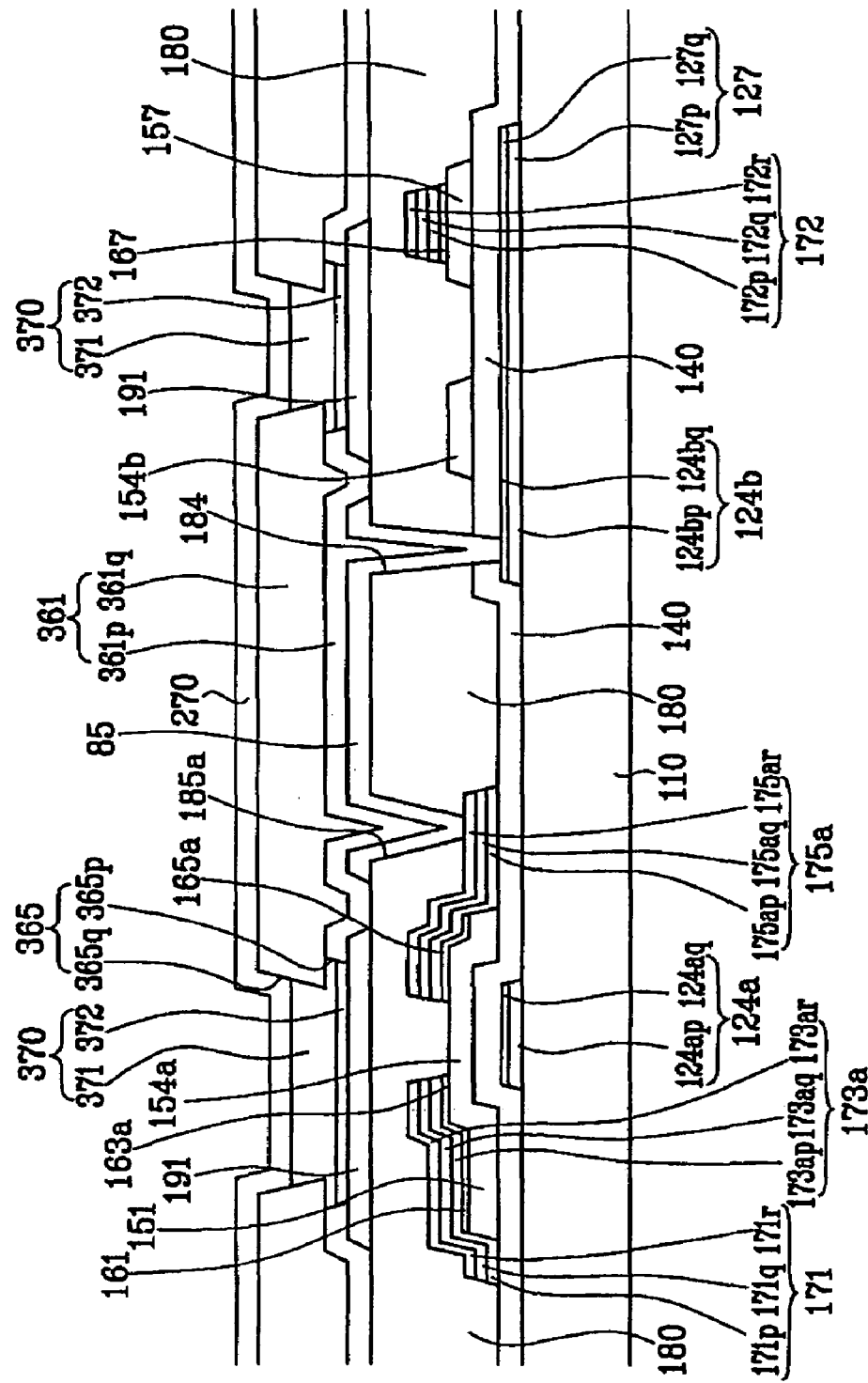

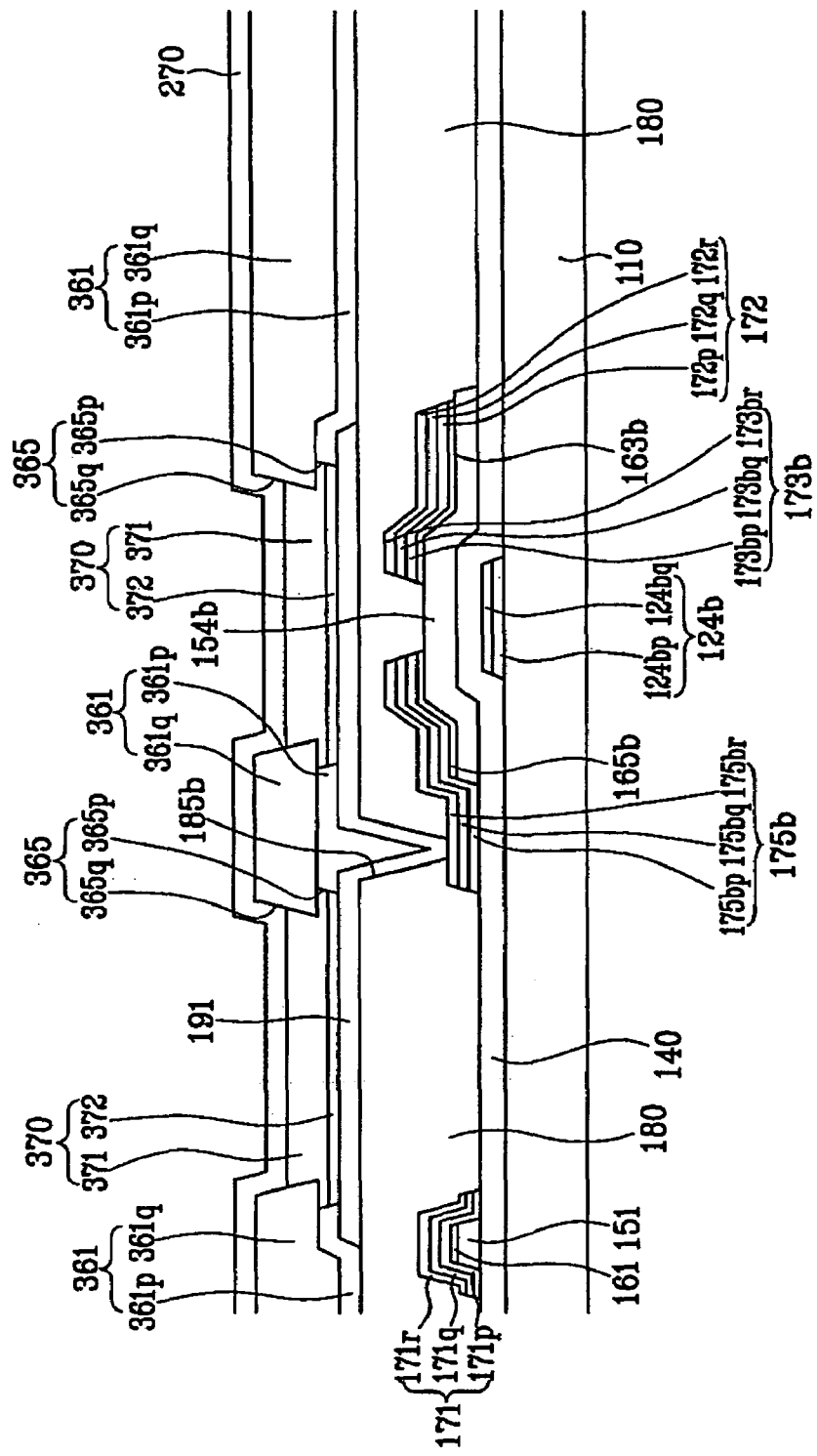

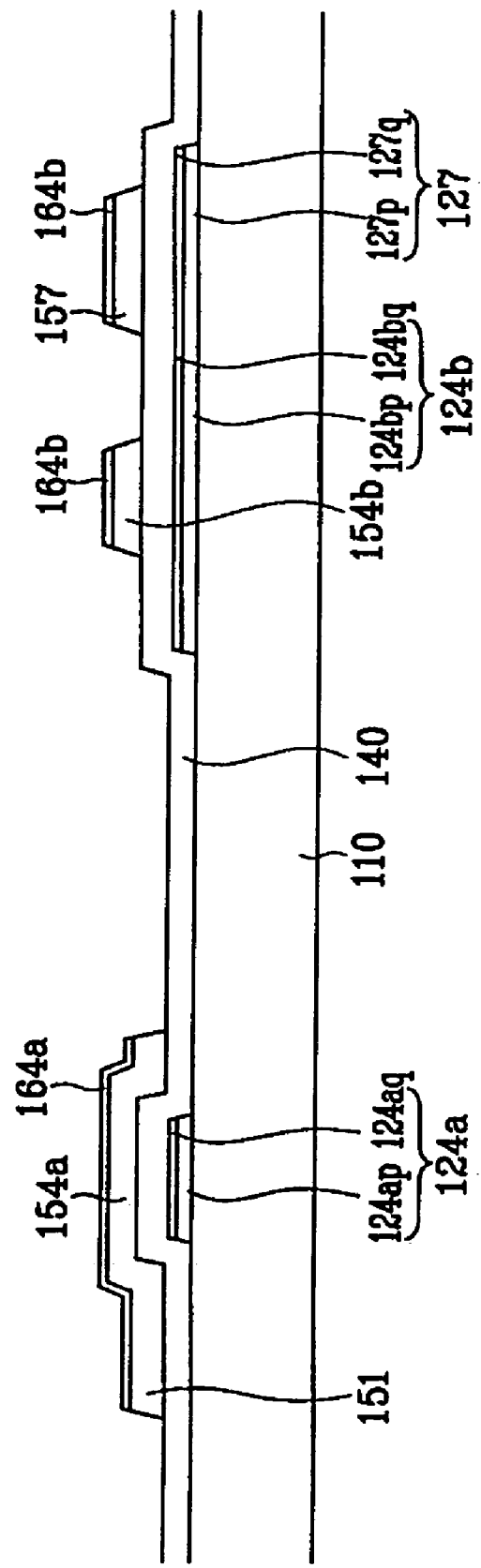

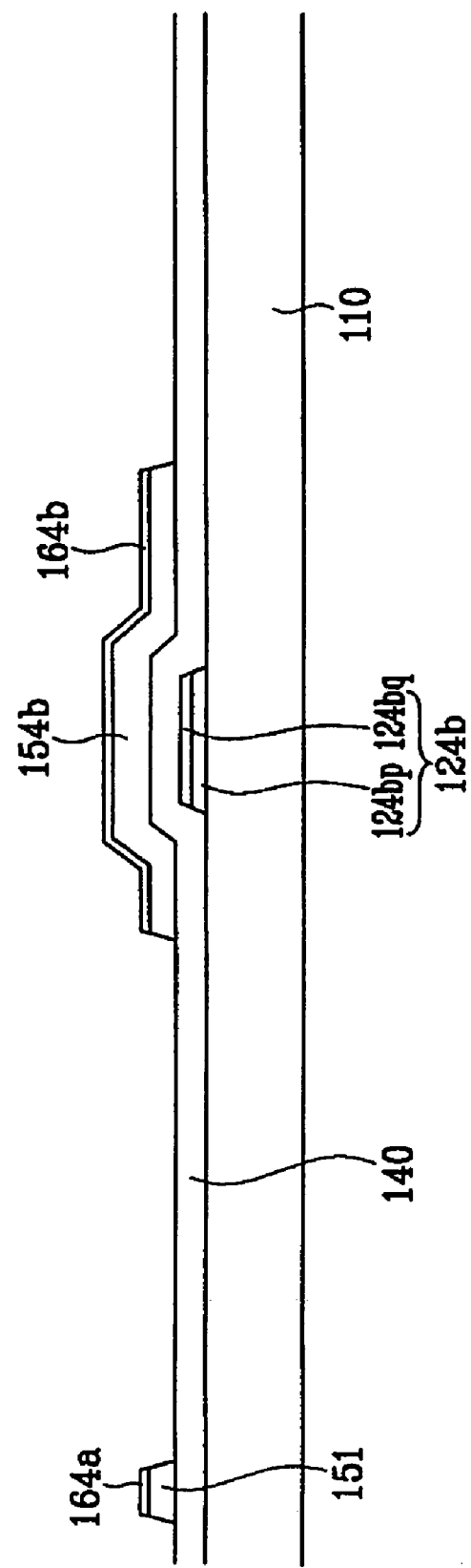

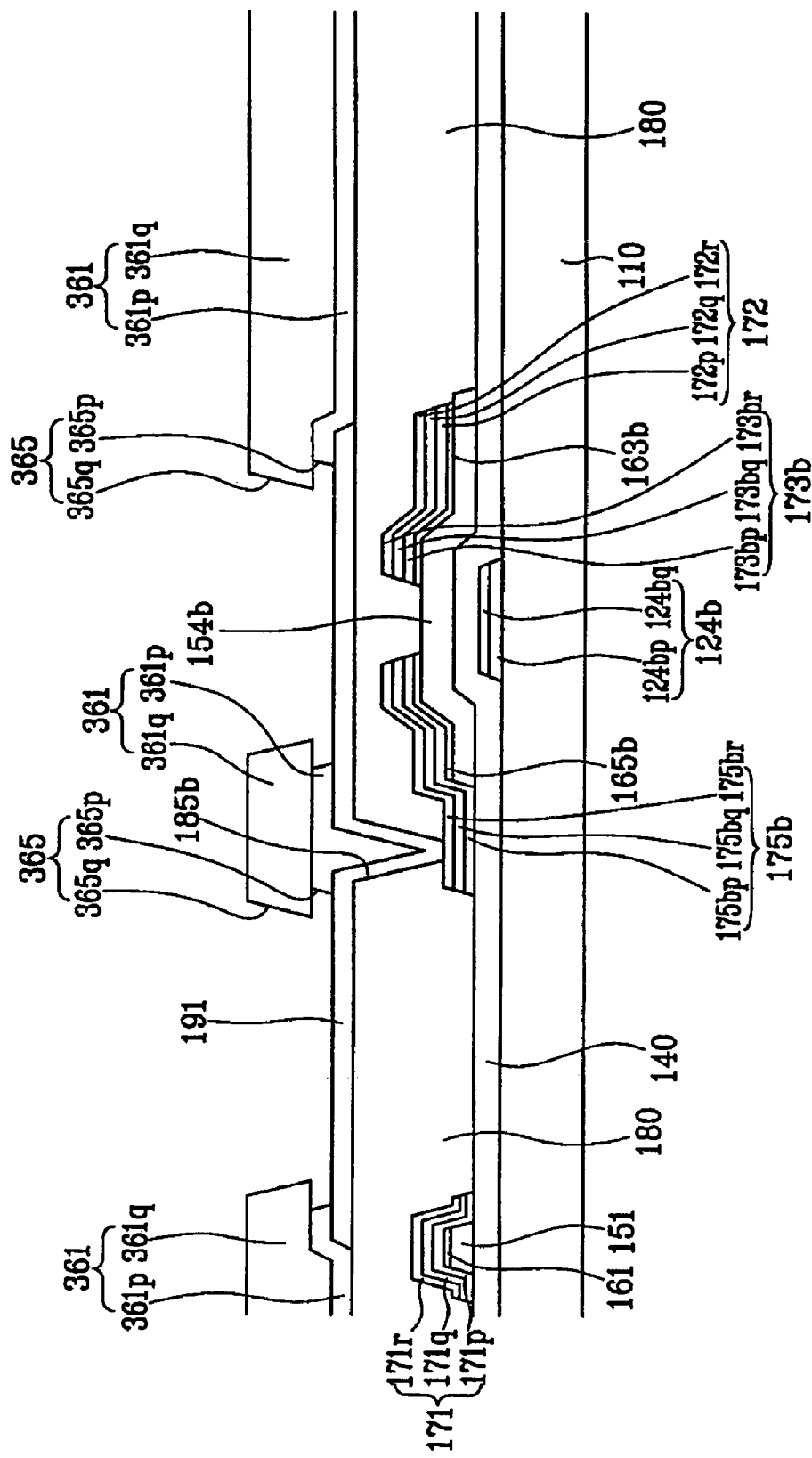

ORGANIC LIGHT EMITTING DIODE DISPLAY AND MANUFACTURING METHOD WITH PARTITION AND EMISSION REGIONS TO IMPROVE EMISSION CHARACTERISTICS

CROSS REFERENCE TO RELATED APPLICATION

This application claims priority to and the benefit of Korean Patent Application No. 10-2005-0018113, filed on Mar. 4, 2005, which is hereby incorporated by reference for all purposes as if fully set forth herein.

BACKGROUND OF THE INVENTION

1. Field of the Invention

The invention relates to an organic light emitting display and manufacturing method thereof.

2. Description of Related Art

An organic light emitting diode (OLED) display is a self emissive display device, which displays images by exciting an emissive organic material to emit light. The OLED display includes an anode (hole injection electrode), a cathode (electron injection electrode), and an organic light emission layer interposed therebetween. When the holes and the electrons are injected into the light emission layer, they recombine to form excitons, which emit light when they transition from an excited state to a ground state.

A plurality of pixels typically comprise an OLED display, each pixel includes an anode, a cathode, and a light emission layer, and are arranged in a matrix. The pixels may be driven in passive matrix (or simple matrix) addressing or active matrix addressing.

A passive matrix type OLED display includes a plurality of anode lines, a plurality of cathode lines intersecting the anode lines and a plurality of pixels, each pixel including a light emission layer. The selection of one of the anode lines and one of the cathode lines cause light emission of the pixel located at the intersection of the selected signal lines.

The active matrix type OLED display includes a plurality of pixels, each including a switching transistor, a driving transistor and a storage capacitor, as well as an anode, a cathode, and a light emission layer. The active matrix type OLED display further includes a plurality of gate lines transmitting gate signals and a plurality of data lines transmitting data voltages. The switching transistor is coupled to one of the gate lines and one of the data lines and transmits the data voltage from the data line in response to the gate signal. The driving transistor receives the data voltage from the switching transistor and drives a current having a magnitude determined depending on the data voltage. The current from the driving transistor enters the light emission layer to cause light emission having intensity depending on the current. The storage capacitor is coupled to the data voltage to maintain the data voltage. The gray scaling of the active matrix type OLED display may be accomplished by controlling the data voltages applied to the driving transistor for adjusting the current driven by the driving transistor. The color representation of the OLED display is obtained by providing red, green and blue light emission layers.

In this active matrix type OLED display, uniform thickness of the light emission layer and large emission area without current leakage are required for high emission quality.

However, the uniformity of the light emission layer thickness is not easily obtained and undesired current leakage near the edges of the light emission layer is often generated.

SUMMARY OF THE INVENTION

Embodiments of this invention provide an OLED that may have improved uniformity of light emission while preventing decreased emissive efficiency due to leakage current.

Additional features of the invention will be set forth in the description which follows, and in part will be apparent from the description, or may be learned by practice of the invention.

An organic light emitting display according to an embodiment of the invention includes a substrate, a first electrode disposed on the substrate, a first partition disposed on the first electrode and having an opening exposing the first electrode, and a second partition that is disposed on the first partition. The second partition is wider than the first partition, defines an emission area, and includes photosensitive organic material. An emission layer is disposed in the emission area, and a second electrode is disposed on the emission layer.

In another aspect of the invention, a method of manufacturing an organic light emitting display according to an embodiment includes forming a first electrode on a substrate, depositing an insulating layer on the first electrode, depositing a photosensitive organic layer on the insulating layer, light-exposing and developing the photosensitive organic layer to form an upper partition, etching the insulating layer using the upper partition as an etch mask to form a lower partition having an opening exposing the first electrode, forming an emission layer in the opening, and forming a second electrode on the emission layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 3A and 3B are sectional views of the OLED display shown in FIG. 2 taken along the lines IIIA-IIIA' and IIIB-IIIB', respectively;

FIGS. 8A and 8B are sectional views of the OLED display shown in FIG. 7 taken along the lines VIIIA-VIIIA' and VIIIB-VIIIB', respectively;

FIGS. 18A and 18B are sectional views of the OLED display shown in FIG. 17 taken along the lines XVIIIA-XVIIIA' and XVIIIB-XVIIIB', respectively.

DETAILED DESCRIPTION OF EMBODIMENTS

Figure 1:
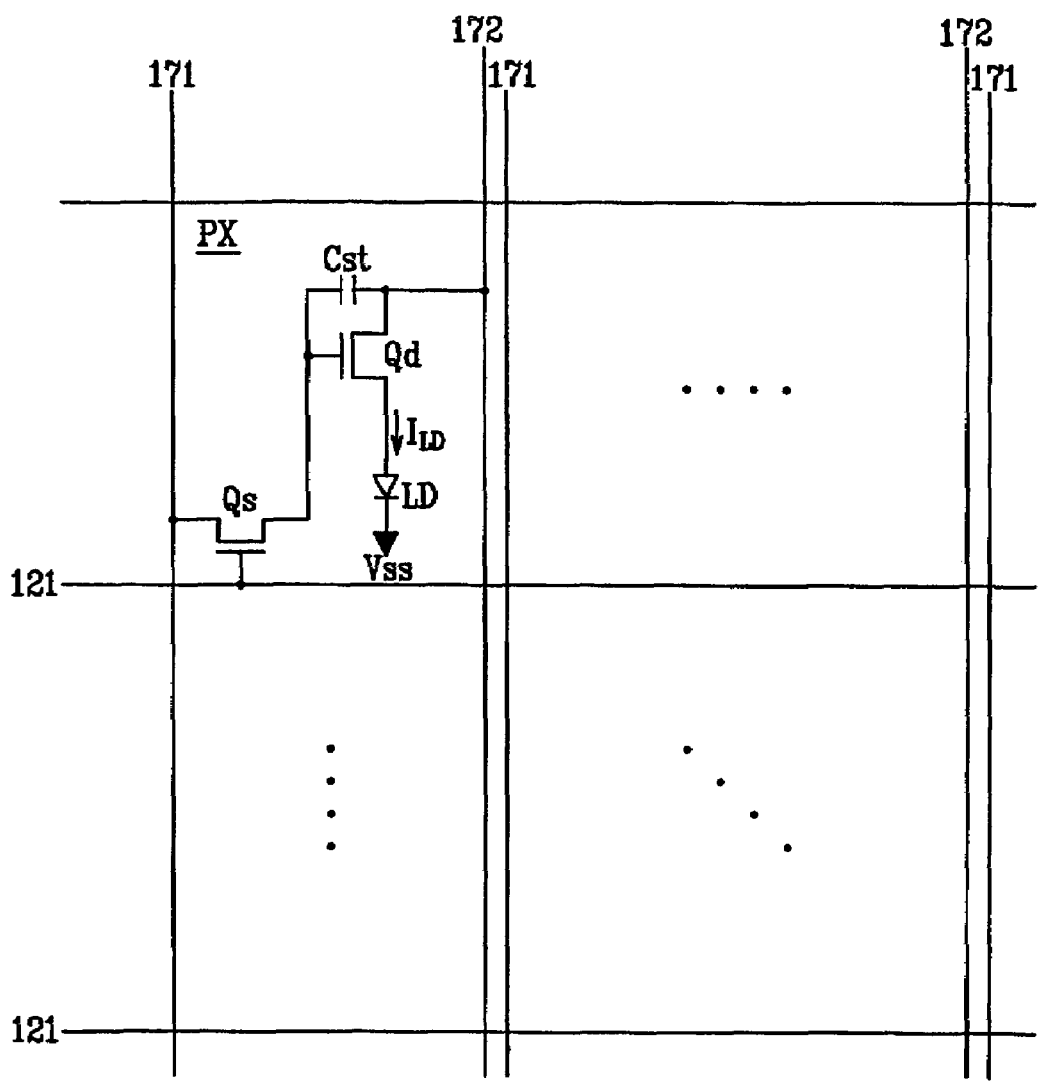
FIG. 1 is an equivalent circuit diagram of an OLED display according to an embodiment of the invention.

The invention will now be described more fully hereinafter with reference to the accompanying drawings, in which preferred embodiments of the invention are shown. The invention may, however, be embodied in many different forms and should not be construed as limited to the embodiments set forth herein.

In the drawings, the thickness of layers, films, panels, regions, etc. are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

First, an OLED display according to an embodiment of the invention is described in detail with reference to FIG. 1. FIG. 1 is an equivalent circuit diagram of an OLED display according to an embodiment of the invention and includes a plurality of signal lines 121, 171 and 172 and a plurality of pixels PX coupled thereto and arranged substantially in a matrix.

The signal lines include a plurality of gate lines 121 transmitting gate signals (or scanning signals), a plurality of data lines 171 transmitting data signals, and a plurality of driving voltage lines 172 transmitting a driving voltage. The gate lines 121 extend substantially in a row direction and substantially parallel to each other, while the data lines 171 and the driving voltage lines 172 extend substantially in a column direction and substantially parallel to each other.

Each pixel PX includes a switching transistor Qs, a driving transistor Qd, a capacitor Cst, and an OLED LD. The switching transistor Qs has a control terminal coupled to one of the gate lines 121, an input terminal coupled to one of the data lines 171, and an output terminal coupled to the driving transistor Qd. The switching transistor Qs transmits the data signals applied to the data line 171 to the driving transistor Qd in response to the gate signal applied to the gate line 121.

The driving transistor Qd has a control terminal coupled to the switching transistor Qs, an input terminal coupled to the driving signal line 172, and an output terminal coupled to the OLED LD. The driving transistor Qd drives an output current $I_{LD}$ having a magnitude depending on the voltage between the control terminal and the input terminal thereof.

The capacitor Cst is coupled between the control terminal and the input terminal of the driving transistor Qd. The capacitor Cst stores the data signal applied to the control terminal of the driving transistor Qd and maintains the data signal after the switching transistor Qs turns off.

The OLED LD has an anode coupled to the output terminal of the driving transistor Qd and a cathode coupled to a common voltage Vss. The OLED LD emits light having an intensity depending on an output current $I_{LD}$ of the driving transistor Qd, thereby displaying images.

The switching transistor Qs and the driving transistor Qd are n-channel field effect transistors (FETs). However, at least one of switching transistor Qs and the driving transistor Qd may be a p-channel FET. In addition, the connections among the transistors Qs and Qd, the capacitor Cst, and the OLED LD may be modified.

Figure 2:
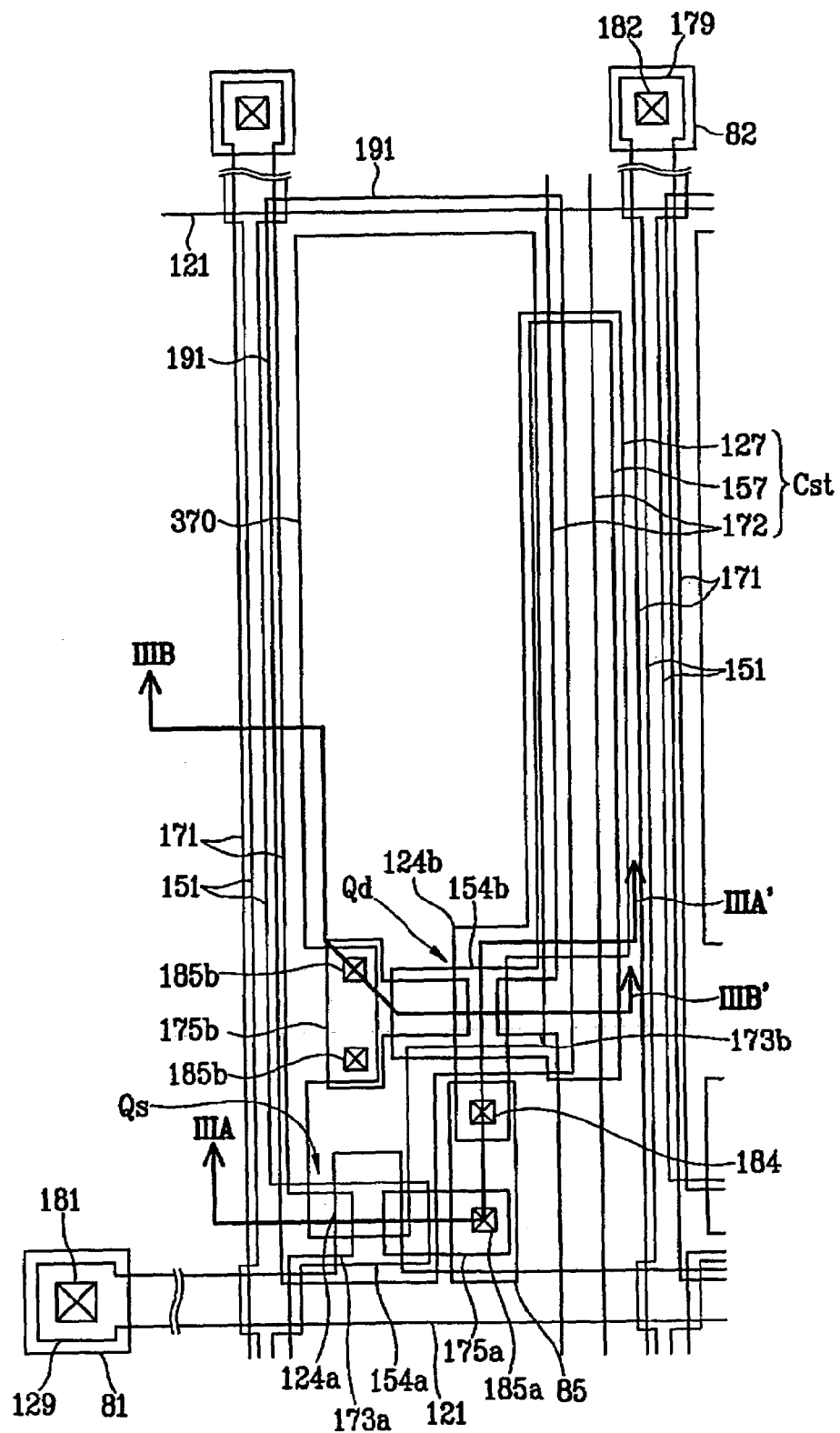
FIG. 2 is a layout view of an OLED display according to an embodiment of the invention.
Figure 4:
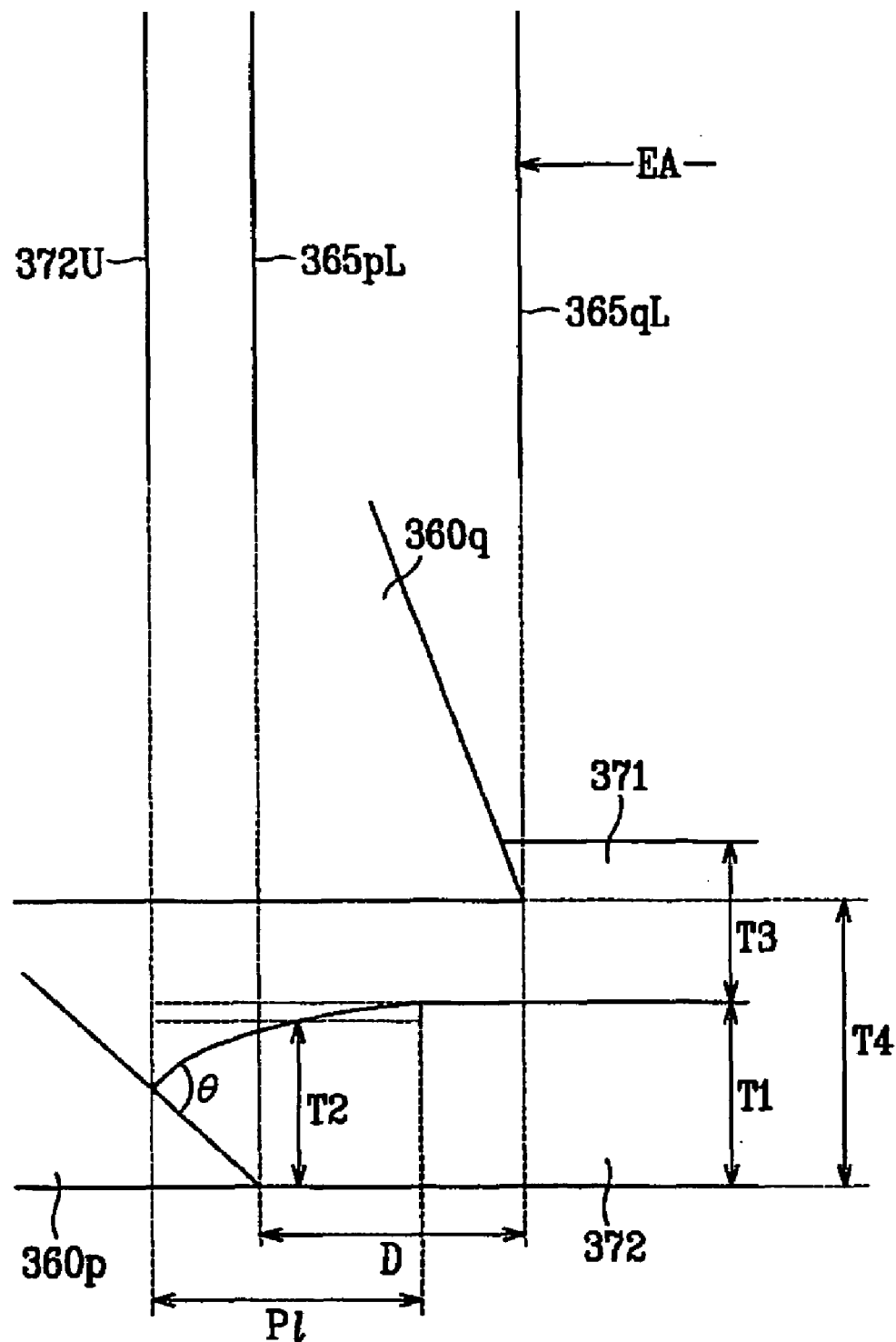
FIG. 4 is an enlarge view of an organic light emitting member according to an embodiment of the invention.
Figure 5:
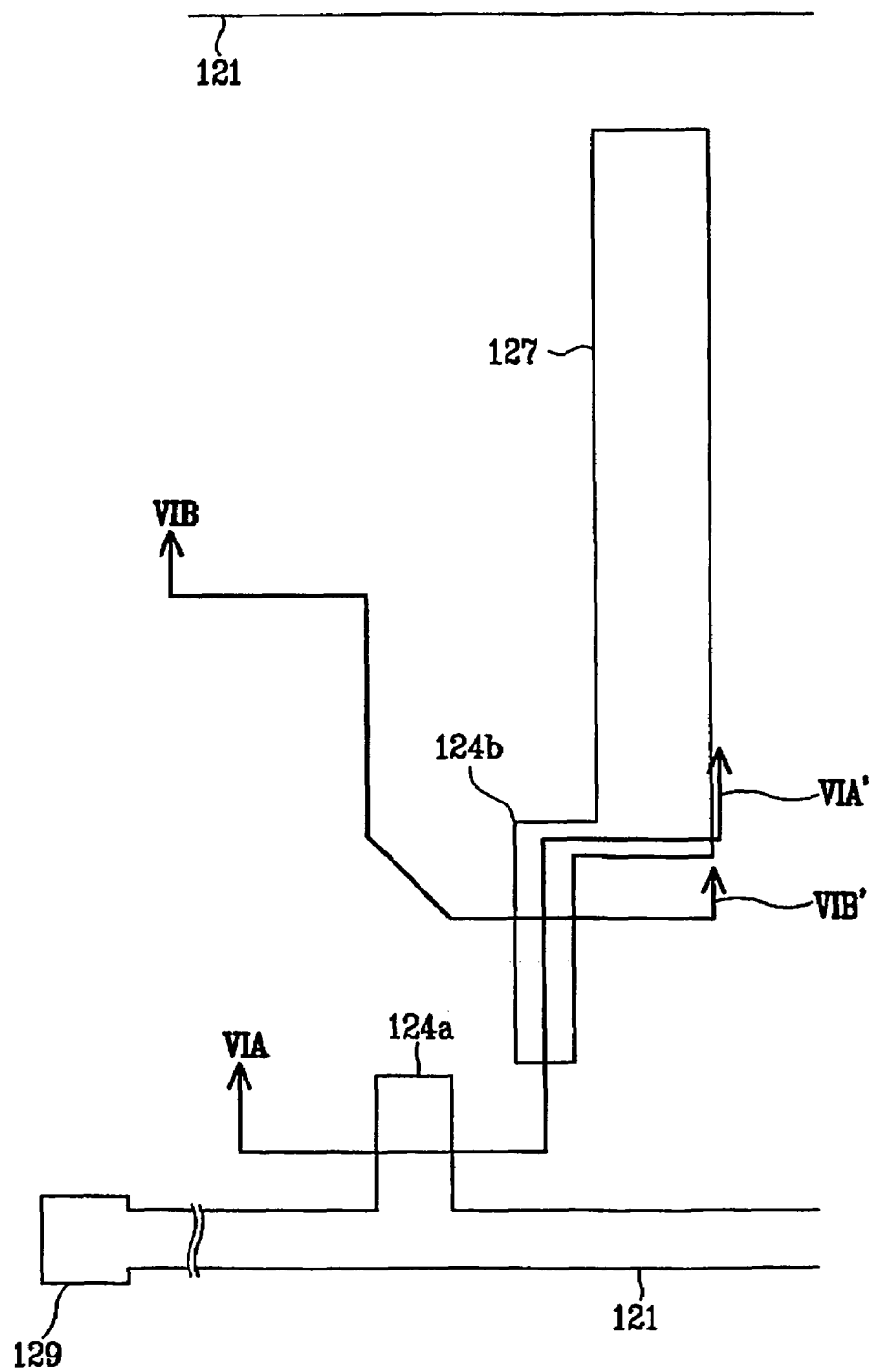
FIGS. 5, 7, 9, 11, 13, 17 and 19 are layout views of the OLED display shown in FIGS. 2-3B in intermediate steps of a manufacturing method thereof according to an embodiment of the invention.

Referring to FIGS. 2-4, a detailed structure of the OLED display shown in FIG. 1 according to an embodiment of the invention will be described in detail.

FIG. 2 is a layout view of an OLED display according to an embodiment of the invention and FIGS. 3A and 3B are sectional views of the OLED display shown in FIG. 2 taken along the lines IIIA-IIIA' and IIIB-IIIB', respectively.

A plurality of gate conductors that include a plurality of gate lines 121 including first control electrodes 124a and a plurality of second control electrodes 124b are formed on an insulating substrate 110 such as transparent glass or plastic.

The gate lines 121 for transmitting gate signals extend substantially in a transverse direction. Each gate line 121 further includes an end portion 129 having a large area for contact with another layer or an external driving circuit, and the first control electrodes 124a project upward from the gate line 121. The gate lines 121 may extend to be directly coupled to a gate driving circuit (not shown) for generating the gate signals, which may be integrated on the substrate 110.

Each of the second control electrodes 124b is separated from the gate lines 121 and it includes a storage electrode 127 extending upward.

The gate conductors 121 and 124b include two films having different physical characteristics, a lower film and an upper film. The lower film is preferably made of low resistivity metal, for example, an Al containing metal such as Al or Al alloy, an Ag containing metal such as Ag or Ag alloy and/or a Cu containing metal such as Cu or Cu alloy for reducing signal delay or voltage drop. The upper film is preferably made of material such as Mo containing material such as, for example, Mo, Mo alloy, and Mo nitride, or material such as Cr, Ta, or Ti, which has good physical, chemical, and electrical contact characteristics with other materials such as indium tin oxide (ITO) or indium zinc oxide (IZO). A good example of the combination is a lower Al (alloy) film and an upper Mo (alloy) film. In particular, an Al—Nd alloy lower film and a Mo containing material upper film are preferable since the etch ratios for the lower and the upper films are almost equal. However, the gate conductors 121 and 124b may have a monolayer structure including one or more of the above-described materials and they may be made of other various metals or conductors.

In FIGS. 3A and 3B, for the first and the second gate electrodes 124a and 124b and the storage electrodes 127, the lower and upper films thereof are denoted by additional characters p and q, respectively.

The lateral sides of the gate conductors 121 and 124b are inclined relative to a surface of the substrate 110, and the inclination angle thereof ranges about 30-80 degrees.

A gate insulating layer 140 preferably made of silicon nitride (SiNx) or silicon oxide (SiOx) is formed on the gate conductors 121 and 124b.

A plurality of semiconductor stripes and islands 151 and 154b preferably made of hydrogenated amorphous silicon (abbreviated to "a-Si") or polysilicon are formed on the gate insulating layer 140. The semiconductor stripes 151 extend substantially in the longitudinal direction and become wide near the gate lines 121 such that the semiconductor stripes 151 cover large areas of the gate lines 121. Each semiconductor stripe 151 includes a plurality of projections 154a branched out toward the first gate electrodes 124a. Each of the semiconductor islands 154b intersects the second control electrodes 124b and includes an extension 157 overlapping a storage electrode 127.

A plurality of pairs of ohmic contact stripes 161, including projections 163a, and islands 165a and a plurality of pairs of ohmic contact islands 163b and 165b are formed on the semiconductor stripes and islands 151 and 154b, respectively. The ohmic contacts 161, 163b, 165a and 165b are preferably made of silicide or n+ hydrogenated a-Si heavily doped with n type impurity such as phosphorous. The ohmic contacts 161 and 165a are located in pairs on the semiconductor stripes 151, and the ohmic contacts 163b and 165b are located in pairs on the second semiconductor islands 154b.

The lateral sides of the semiconductor stripes and islands 151 and 154b and the ohmic contacts 161, 163b, 165a and 165b are inclined relative to the surface of the substrate 110, and the inclination angle thereof ranges about 30-80 degrees.

A plurality of data conductors including a plurality of data lines 171, a plurality of driving voltage lines 172, and a plurality of first and second output electrodes 175a and 175b are formed on the ohmic contacts 161, 163b, 165b and 165b and the gate insulating layer 140.

The data lines 171 for transmitting data signals extend substantially in the longitudinal direction and cross the gate lines 121. Each data line 171 includes a plurality of first input electrodes 173a extending toward the first control electrodes 124a and an end portion 179 having a large area for contact with another layer or an external driving circuit. The data lines 171 may extend to be directly coupled to a data driving circuit (not shown) for generating the data signals, which may be integrated on the substrate 110.

The driving voltage lines 172 for transmitting driving voltages extend substantially in the longitudinal direction and cross the gate lines 121. Each driving voltage line 172 includes a plurality of second input electrodes 173b extending toward the second control electrodes 124b. The driving voltage lines 172 overlap the storage electrodes 127 and they may be coupled to each other.

The first and the second output electrodes 175a and 175b are separated from each other and from the data lines 171 and the driving voltage lines 172. Each pair of the first input electrodes 173a and the first output electrodes 175a are disposed opposite each other with respect to a first control electrode 124a, and each pair of the second input electrodes 173b and the second output electrodes 175b are disposed opposite each other with respect to a second control electrode 124b.

The data conductors 171, 172, 175a and 175b include a lower film 171p, 172p, 175ap and 175bp, an intermediate film 171q, 172q, 175aq and 175bq, and an upper film 171r, 172r, 175ar and 175br. The lower film 171p, 172p, 175ap and 175bp is preferably made of Mo containing metal such as MoNb alloy, the intermediate film 171q, 172q, 175aq and 175bq is preferably made of Al containing metal, and the upper film 171r, 172r, 175ar and 175br is made of Mo containing metal such as MoNb alloy.

However, the lower and the upper films 171p, 172p, 175ap, 175bp, 171r, 172r, 175ar and 175br of the data conductors 171, 172, 175a and 175b may be made of any refractory metal including Cr, Ti, Ta or alloys thereof and the intermediate film 171q, 172q, 175aq and 175bq of the data conductors 171, 172, 175a and 175b may be made of any other low resistivity material. The data conductors 171, 172, 175a and 175b may also have a monolayer structure including the above-described materials and a dual-layered structure preferably including a refractory metal film and a low resistivity film. Examples of the dual-layered structure include a lower Cr film and an upper Al (alloy) film, and a lower Mo (alloy) film and an upper Al (alloy) film. However, the data conductors 171, 172, 175a and 175b may be made of other various metals or conductors.

In FIGS. 3A and 3B, the lower, the intermediate, and the upper films of the first input electrodes 173a are denoted by reference numerals 173ap, 173aq, and 173ar, respectively, and the lower, the intermediate, and the upper films of the second input electrodes 173b are denoted by reference numerals 173bp, 173bq, and 173br, respectively.

Like the gate conductors 121 and 124b, the data conductors 171, 172, 175a and 175b have inclined edge profiles, and the inclination angles thereof range about 30-80 degrees.

The ohmic contacts 161, 163b, 165b and 165b are interposed only between the underlying semiconductor stripes and islands 151 and 154b and the overlying data conductors 171, 172, 175a and 175b and reduce the contact resistance therebetween.

Although the semiconductor stripes 151 are narrower than the data lines 171 at most places, the width of the semiconductor stripes 151 becomes larger near the gate lines 121 as described above, to smooth the profile of the surface, thereby preventing the disconnection of the data lines 171. The semiconductor stripes and islands 151 and 154b include a plurality of exposed portions, which are not covered with the data conductors 171, 172, 175a and 175b, such as portions disposed between the input electrodes 173a and 173b and the output electrodes 175a and 175b.

A passivation layer 180 is formed on the data conductors 171, 172, 175a and 175b and the exposed portions of the semiconductor stripes and islands 151 and 154b. The passivation layer 180 is preferably made of inorganic insulator such as silicon nitride and/or silicon oxide, an organic insulator such as a polyacrylic compound, or a low dielectric insulator. The low dielectric insulator and the organic insulator preferably have a dielectric constant less than about 4.0 and includes a-Si:C:O and a-Si:O:F formed by plasma enhanced chemical vapor deposition (PECVD). The organic insulator for the passivation layer 180 may be photosensitive and the passivation 180 may have a flat surface. The passivation layer 180 may include a lower film of inorganic insulator and an upper film of organic insulator such that use of the excellent insulating characteristics of the organic insulator is realized while preventing the exposed portions of the semiconductor stripes and islands 151 and 154b from being damaged by the organic insulator.

The passivation layer 180 has a plurality of contact holes 182, 185a and 185b exposing the end portions 179 of the data lines 171, the first output electrodes 175a, and the second output electrodes 175b, respectively, and the passivation layer 180 and the gate insulating layer 140 have a plurality of contact holes 181 and 184 exposing the end portions 129 of the gate lines 121 and the second control electrodes 124b, respectively.

A plurality of pixel electrodes 191, a plurality of connecting members 85, and a plurality of contact assistants 81 and 82 are formed on the passivation layer 180, and they are preferably made of transparent conductor such as ITO or IZO.

The pixel electrodes 191 are coupled to the second output electrodes 175b through the contact holes 185b and the connecting members 85 are coupled to the second control electrodes 124b and the first output electrodes 175a through the contact holes 184 and 185a, respectively.

The contact assistants 81 and 82 are coupled to the end portions 129 of the gate lines 121 and the end portions 179 of the data lines 171 through the contact holes 181 and 182, respectively. The contact assistants 81 and 82 protect the end portions 129 and 179 and complement the adhesion between the end portions 129 and 179 and external devices.

A partition 361 including a lower partition 361p and an upper partition 361q is formed on the passivation layer 180. The partition 361 surrounds the pixel electrodes 191 like a bank to define openings 365. Each opening 365 includes a lower opening 365p defined by the lower partition 361p and an upper opening 365q defined by the upper partition 361q. The lower opening 365p is larger than the upper opening 365q such that top edges of the lower opening 365p are disposed out of bottom edges of the upper opening 365q. Sidewalls of the upper opening 365q are inclined at positive gradient and so are sidewalls of the lower opening 365p. However, the sidewalls of the lower and the upper openings 365p and 365q may be inclined vertical or at negative gradient.

The lower partition 361p is preferably made of organic or inorganic insulating material, and the upper partition 361q is preferably made of organic insulating material that may have positive photosensitivity and hydrophobic characteristics. The partition 361 may contain black pigment so that the black partition 361 may serve as a light blocking member. However, the partition 361 can be made any of organic or inorganic insulators.

A plurality of light emitting members 370 are formed on the pixel electrodes 191 and confined in the openings 365 defined by the partition 361. Each of the light emitting members 370 includes an emitting layer 371 and a hole transport layer 372 disposed thereunder.

The emitting layer 371 is preferably made of a high molecular weight organic compound or soluble low molecular weight compound uniquely emitting one of primary color lights such as red, green and blue lights. The OLED display displays images by spatially adding the monochromatic primary color lights emitted from the light emitting members 370.

The emitting layer 371 has a bottom surface lower than the bottom surface of the upper partition 361q and a top surface higher than the bottom surface of the upper partition 361q such that edges of the bottom surface of the emitting layer 371 are disposed out of the upper opening 365q and an upper portion of the emitting layer 371 contacts the upper partition 361q. At this time, an area (referred to as emission area hereinafter) (EA), where the light emitted from the emitting layer 371 radiates, is substantially equal to an area enclosed by lower boundaries 365qL of the upper opening 365q (see FIG. 4).

The hole transport layer 372 effectively transports holes from a pixel electrode to the emitting layer 371 and has a work function that lies between that of the pixel electrodes 191 and that of the emitting layer 371.

The hole transport layer 372 is thinner than the lower partition 361p such that its top surface is lower than the top surface of the lower partition 361p. In addition, the hole transport layer 372 is wider than the upper opening 365q of the partition 361 such that edges of the hole transport layer 372 lies beyond the upper opening 365q. Referring to FIG. 4, a line 372U formed by the upper surface of the hole transport layer 372 and the lower partition 361p is disposed out of the emission area EA. Reference numeral 365pL shown in FIG. 4 denotes the lower boundaries of the lower opening 365p.

The hole transport layer 372 is preferably made of a high molecular weight compound such as poly(3,4-ethylenedioxythiophene)-poly(styrenesulfonate) (PEDOT/PSS) or a soluble low molecular weight compound. The hole transport layer 372 may be hydrophilic and it may have weak affinity with the emitting layer 371. However, the hole transport layer 372 may be made of other similar materials.

As described above, since the boundary line 372U formed by the top surface of the hole transport layer 372 and the lower partition 361p is disposed out of the emission area EA, the possibility that thin portions P1 of the hole transport layer 372 are disposed in the emission area EA is small even though the angle θ made by the top surface of the hole transport layer 372 with the partition 361q is large such that the thickness T2 near edges 372U of the hole transport layer 372 is smaller than the thickness T1 of other portions. Accordingly, non-uniformity of the intensity of the light emission due to the variation in thickness of the hole transport layer 372 may be prevented.

In addition, since the top surface of the hole transport layer 372 is lower than the top surface of the lower partition 361p or the bottom surface of the upper partition 361q and the top surface of the hole transport layer 372 is wider than the emission area EA, the emitting layer 371 and the hole transport layer 372 contact each other all over the top surface of the hole transport layer 372. Since the incomplete formation of the emitting layer 371, due to the weak affinity between the emitting layer 371 and the hole transport layer 372, may occur near edges of the top surface of the hole transport layer 372 where the two layers 371 and 372 contact each other and the boundary is disposed out of the emission area EA, the emitting layer 371 is complete in the emission area EA.

A common electrode 270 is formed on the light emitting members and the partition 361. The common electrode 270 is supplied with the common voltage Vss and preferably made of low resistivity material such as Al, Ag or low work function material such as Ca, Ba, and Mg.

Each of the light emitting members 370 may further include a hole injecting layer for enhancing the injection of the holes. The light emitting member 370 may further include an electron transport layer (not shown) and an electron injecting layer (not shown) for aiding the transport or the injection of electrons. The electron transport layer and the electron injecting layer may be made of material having a work function that lies between that of the common electrode 270 and that of the emitting layer 371.

In the above-described OLED display, a first control electrode 124a coupled to a gate line 121, a first input electrode 173a coupled to a data line 171, and a first output electrode 175a along with a projection 154a of a semiconductor stripe 151 form a switching TFT Qs having a channel formed in the projection 154a disposed between the first source electrode 173a and the first drain electrode 175a. Likewise, a second control electrode 124b coupled to the first output electrode 175a, a second input electrode 173b coupled to a driving voltage line 172, and a second output electrode 175b coupled to a pixel electrode 191 along with a semiconductor island 154b form a driving TFT Qd having a channel formed in the semiconductor island 154b disposed between the second source electrode 173b and the second drain electrode 175b. A pixel electrode 191, a light emitting member 370, and the common electrode 270 form an OLED LD having the pixel electrode 191 as an anode and the common electrode 270 as a cathode. The overlapping portions of a storage electrode 127, a driving voltage line 172, and the storage region form a storage capacitor Cst.

The OLED display according to this embodiment, which includes the transparent pixel electrodes 191 and the opaque common electrode 270, emits light toward the bottom of the substrate 110, which is referred to as a bottom emission OLED display. However, the invention may be employed to a top emission OLED display that includes opaque pixel electrodes 191 and a transparent common electrode 270 and emits light toward the top of the substrate 110. In addition, the pixel electrodes 191 may serve as cathodes and the common electrode 270 may serve as an anode. In this case, the hole transport layer 372 is substituted with an electron transport layer (not shown). The hole transport layer and the electron transport layer are commonly referred to as a charge transport layer.

The semiconductor stripes and islands 151 and 154b, if made of polysilicon, include intrinsic regions (not shown) disposed under the gate electrodes 124a and 124b and extrinsic regions (not shown) disposed opposite each other with respect to the intrinsic regions. The extrinsic regions are electrically coupled to the input electrodes 173a and 173b and the output electrodes 175a and 175b, and the ohmic contacts 161, 163b, 165a and 165b may be omitted.

The gate electrodes 124a and 124b may be disposed over the semiconductor stripes and islands 151 and 154b, while the gate insulating layer 140 is still interposed between the semiconductor stripes and islands 151 and 154b and the gate electrodes 124a and 124b. Moreover, the data conductors 171, 172, 173b and 175b may be disposed on the gate insulating layer 140 and electrically coupled to the semiconductor stripes and islands 151 and 154b through contact holes (not shown) in the gate insulating layer 140. Otherwise, the data conductors 171, 172, 173b and 175b may be disposed under the semiconductor stripes and islands 151 and 154b and may electrically contact the semiconductor stripes and islands 151 and 154b.

Now, a method of manufacturing the OLED display shown in FIGS. 2-3B according to an embodiment of the invention is described with reference to FIGS. 4-20B as well as FIGS. 2-3B.

Figure 6A:
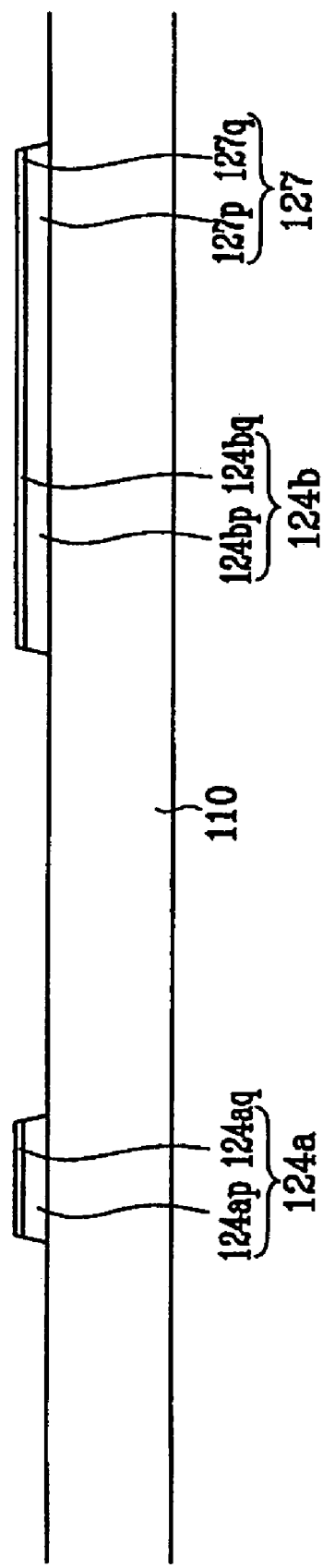
FIGS. 6A and 6B are sectional views of the OLED display shown in FIG. 5 taken along the lines VIA-VIA' and VIB-VIB', respectively.
Figure 6B:
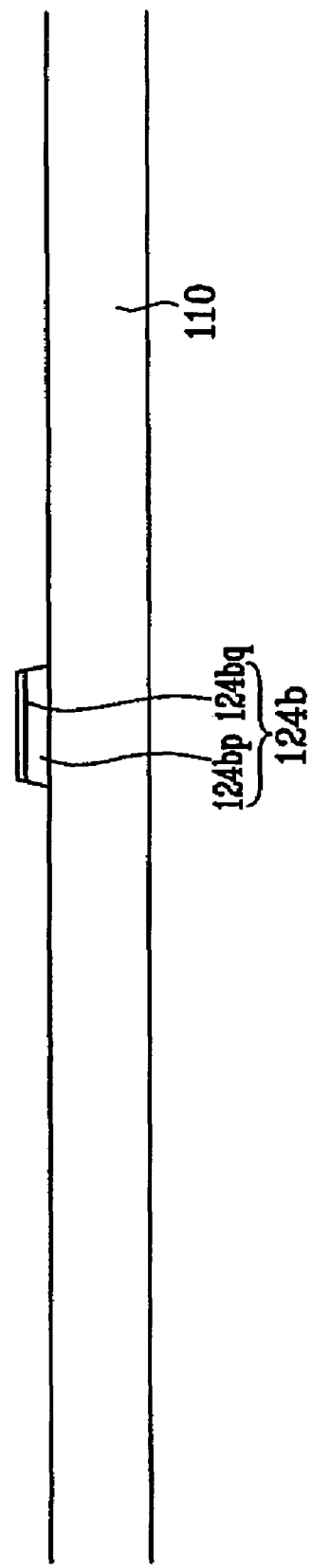

FIGS. 5, 7, 9, 11, 13, 17 and 19 are layout views of the OLED display shown in FIGS. 2-3B in intermediate steps of a manufacturing method thereof according to an embodiment of the invention. FIGS. 6A and 6B are sectional views of the OLED display shown in FIG. 5 taken along the lines VIA-VIA' and VIB-VIB', respectively, FIGS. 8A and 8B are sectional views of the OLED display shown in FIG. 7 taken along the lines VIIIA-VIIIA' and VIIIB-VIIIB', respectively, FIGS. 10A and 10B are sectional views of the OLED display shown in FIG. 9 taken along the lines XA-XA' and XB-XB', respectively, FIGS. 12A and 12B are sectional views of the OLED display shown in FIG. 11 taken along the lines XIIA-XIIA' and XIIB-XIIB', respectively, and FIGS. 14A and 14B are sectional views of the OLED display shown in FIG. 13 taken along the lines XIVA-XIVA' and XIVB-XIVB', respectively. FIGS. 15A and 15B are sectional views of the OLED display shown in FIG. 13 taken along the lines XIVA-XIVA' and XIVB-XIVB', respectively, which illustrate the step following the step shown in FIGS. 14A and 14B, and FIGS. 16A and 16B are sectional views of the OLED display shown in FIG. 13 taken along the lines XIVA-XIVA' and XIVB-XIVB', respectively, which illustrates the step following the step shown in FIGS. 15A and 15B. FIGS. 18A and 18B are sectional views of the OLED display shown in FIG. 17 taken along the lines XVIIIA-XVIIIA' and XVIIIB-XVIIIB', respectively, and FIGS. 20A and 20B are sectional views of the OLED display shown in FIG. 19 taken along the lines XXA-XXA' and XXB-XXB', respectively, Referring to FIGS. 5-6B, a lower conductive film preferably made of Al alloy and an upper conductive film preferably made of Mo alloy are sequentially deposited an insulating substrate 110 such as transparent glass or plastic. The lower conductive film may have a thickness of about 1,000-5,000 Å and the upper conductive film may have a thickness of about 50-2,000 Å. The upper and the lower conductive films are etched preferably using a single etch condition to form gate conductors that include a plurality of gate lines 121 including first control electrodes 124a and end portions 129 and a plurality of second control electrodes 124b including storage electrodes 127. In FIGS. 6A and 6B, for the first and the second gate electrodes 124a and 124b and the storage electrodes 127, the lower and upper films thereof are denoted by additional characters p and q, respectively.

Figure 7:
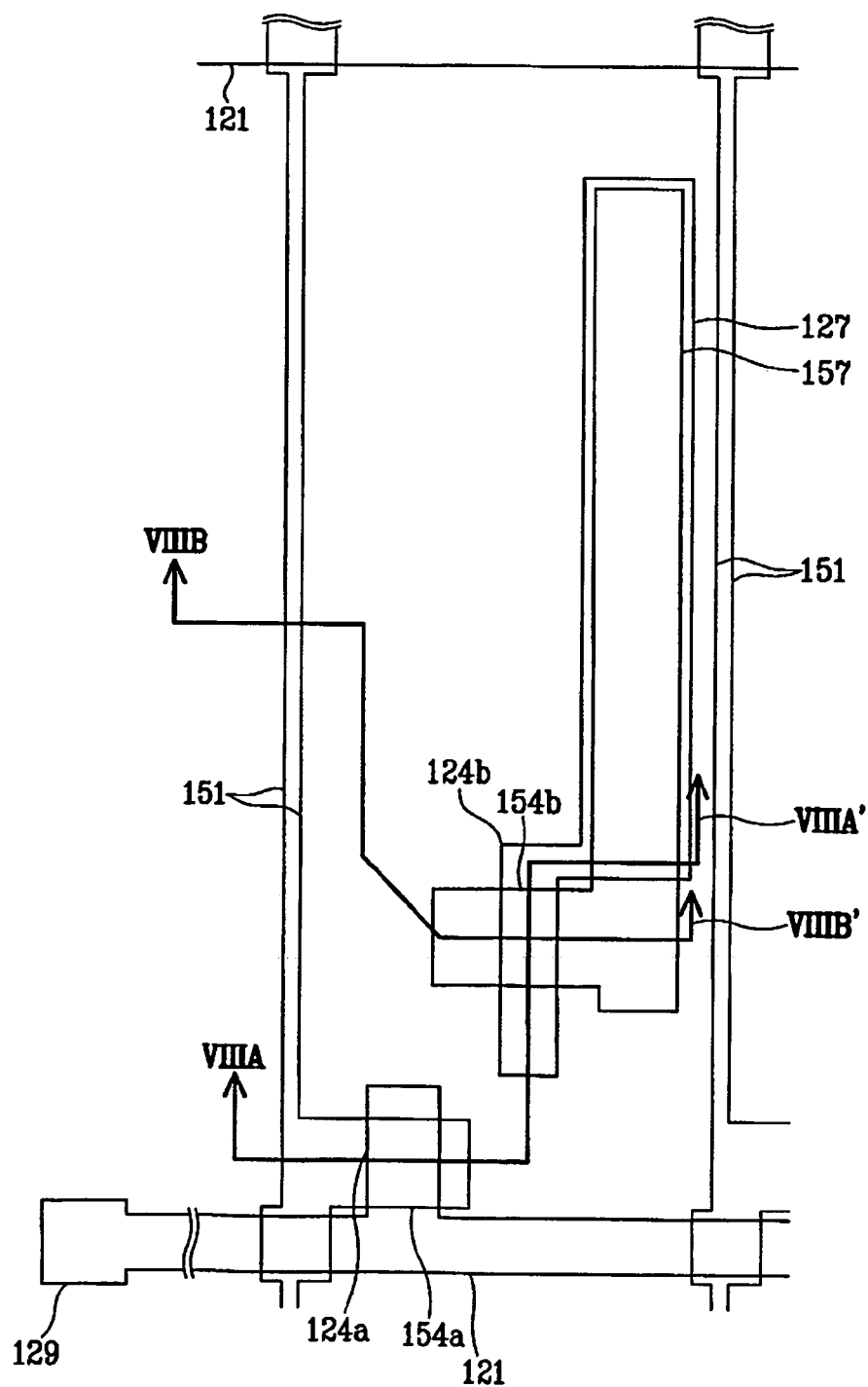

Referring to FIGS. 7-8B, after sequential deposition of a gate insulating layer 140, an intrinsic a-Si layer, and an extrinsic a-Si layer on the gate insulating layer 140, the extrinsic a-Si layer and the intrinsic a-Si layer are patterned by lithography and etched to form a plurality of extrinsic semiconductor stripes and islands 164a and 164b and a plurality of intrinsic semiconductor stripes and islands 151 and 154b. Each of the semiconductor stripes 151 includes a plurality of projections 154a.

Figure 9:
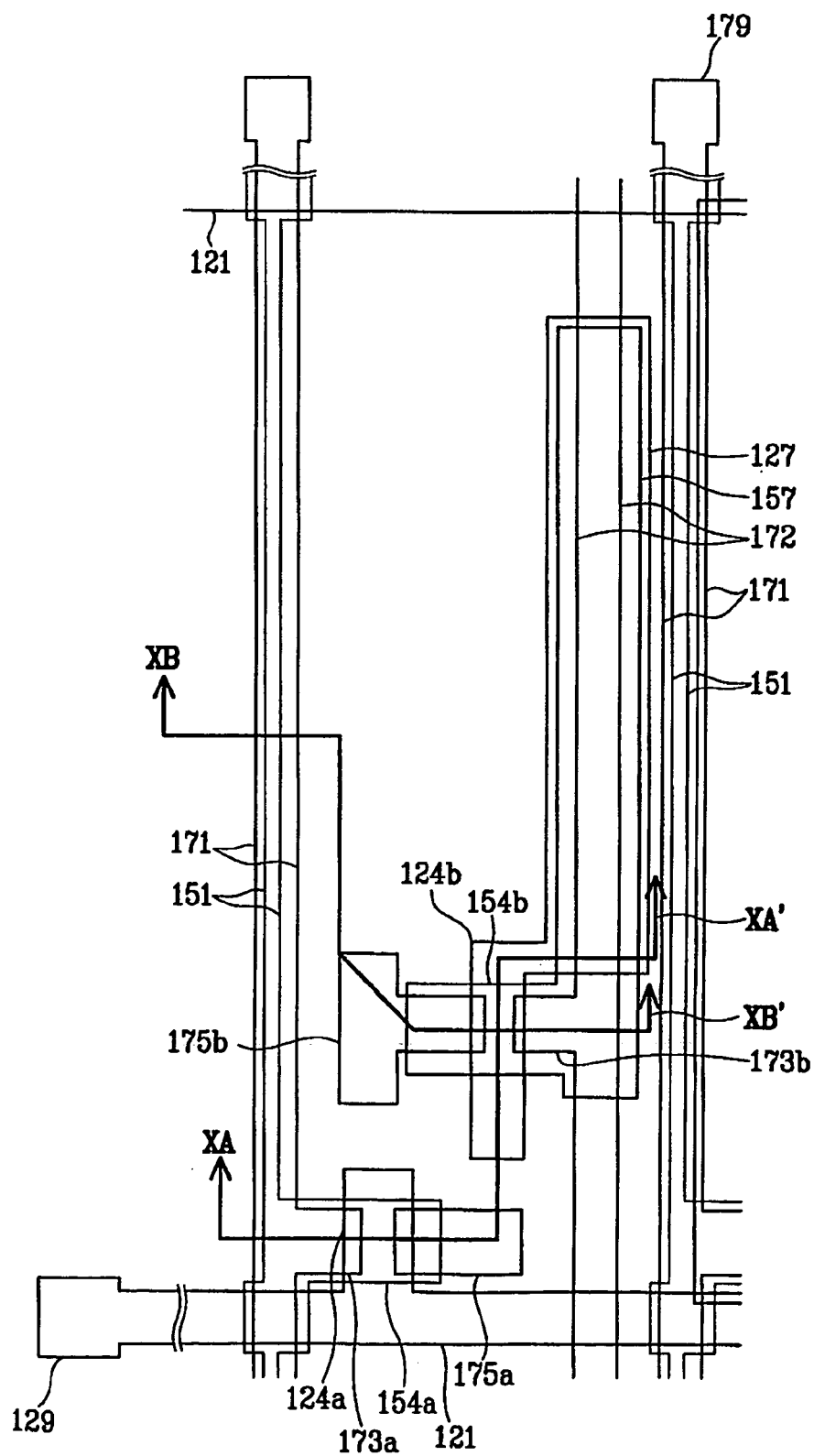
Figure 10A:
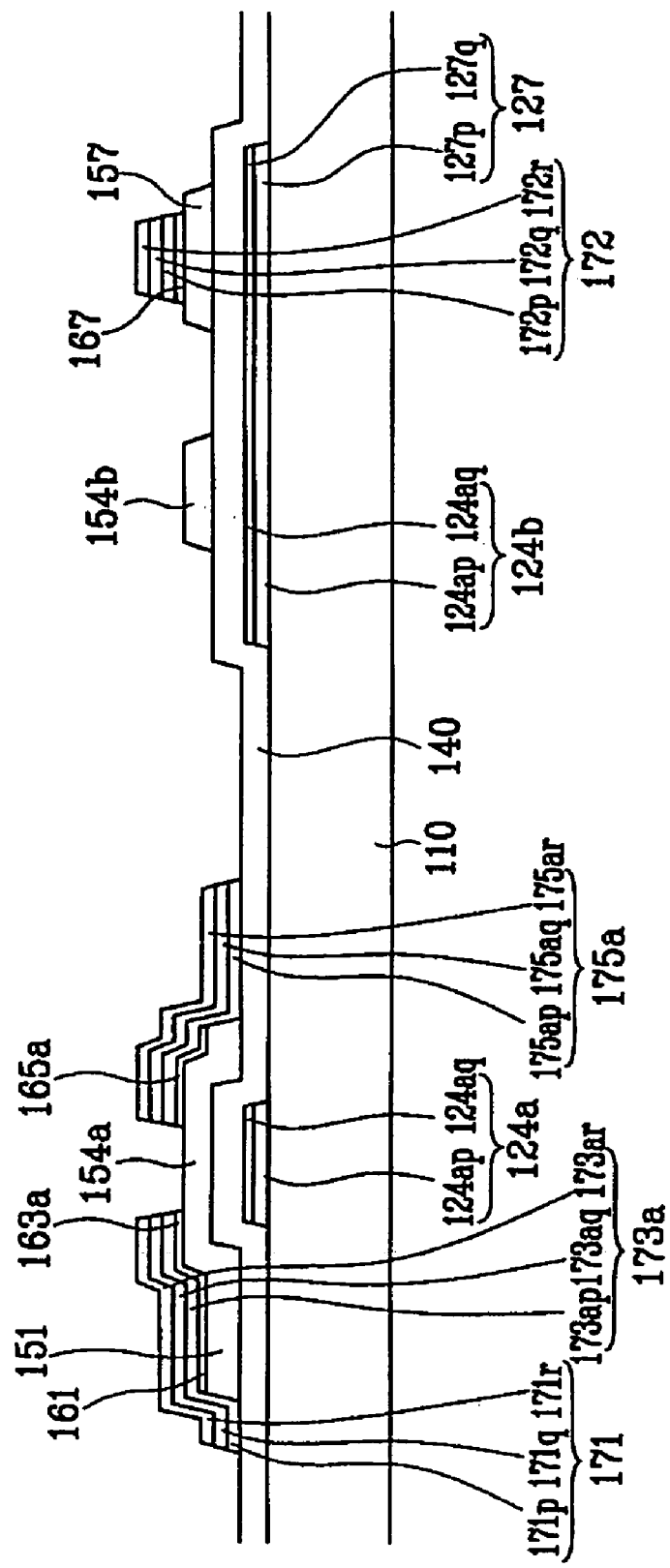
FIGS. 10A and 10B are sectional views of the OLED display shown in FIG. 9 taken along the lines XA-XA' and XB-XB', respectively.
Figure 10B:
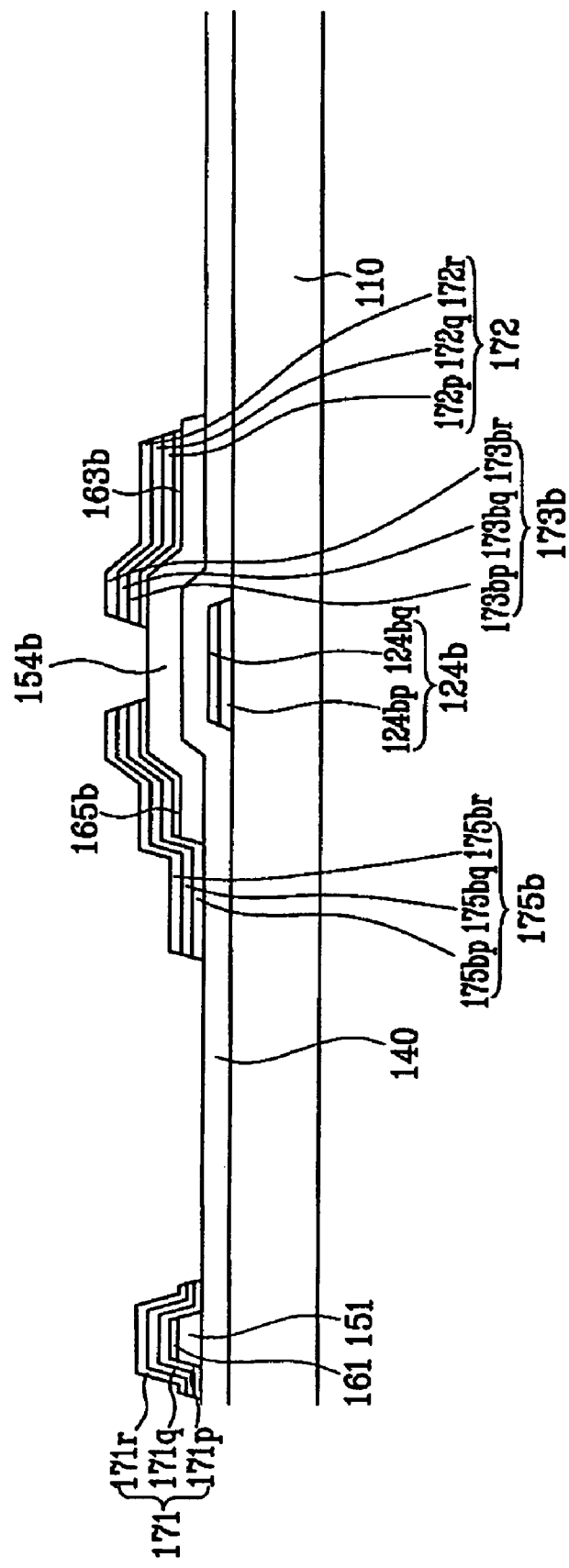

Referring to FIGS. 9-10B, a lower conductive film preferably made of Mo alloy, an intermediate film preferably made of Al or Al alloy, and an upper conductive film preferably made of Mo alloy are successively deposited and patterned by lithography and etched to form data conductors that include a plurality of data lines 171 including first source electrodes 173a, a plurality of driving voltage lines 172 including second source electrodes 173b, and a plurality of first and second drain electrodes 175a and 175b. In FIGS. 10A and 10B, for the first and the second gate electrodes 124a and 124b and the storage electrodes 127, the lower, intermediate, and upper films thereof are denoted by additional characters p, q and r, respectively.

Thereafter, portions of the extrinsic semiconductor stripes 164a and 164b, which are not covered with the data conductors 171, 172, 175a and 175b, are removed by etching to complete a plurality of ohmic contact stripes 161 including projections 163a and a plurality of ohmic contact islands 163b, 165a and 165b and to expose portions of the intrinsic semiconductor stripes and islands 151 and 154b. Oxygen plasma treatment may follow to stabilize the exposed surfaces of the semiconductor stripes and islands 151 and 154b.

Figure 11:
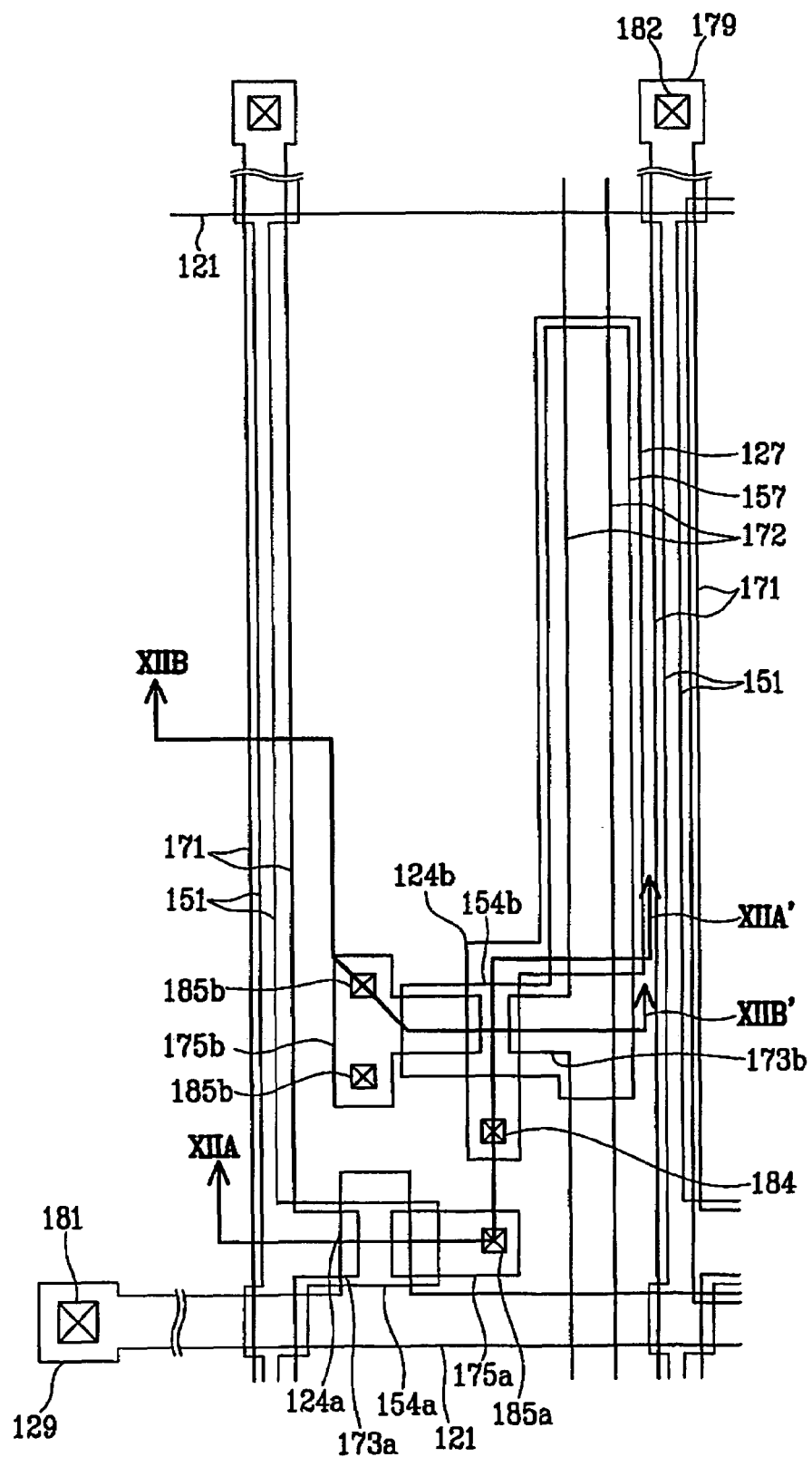
Figure 12A:
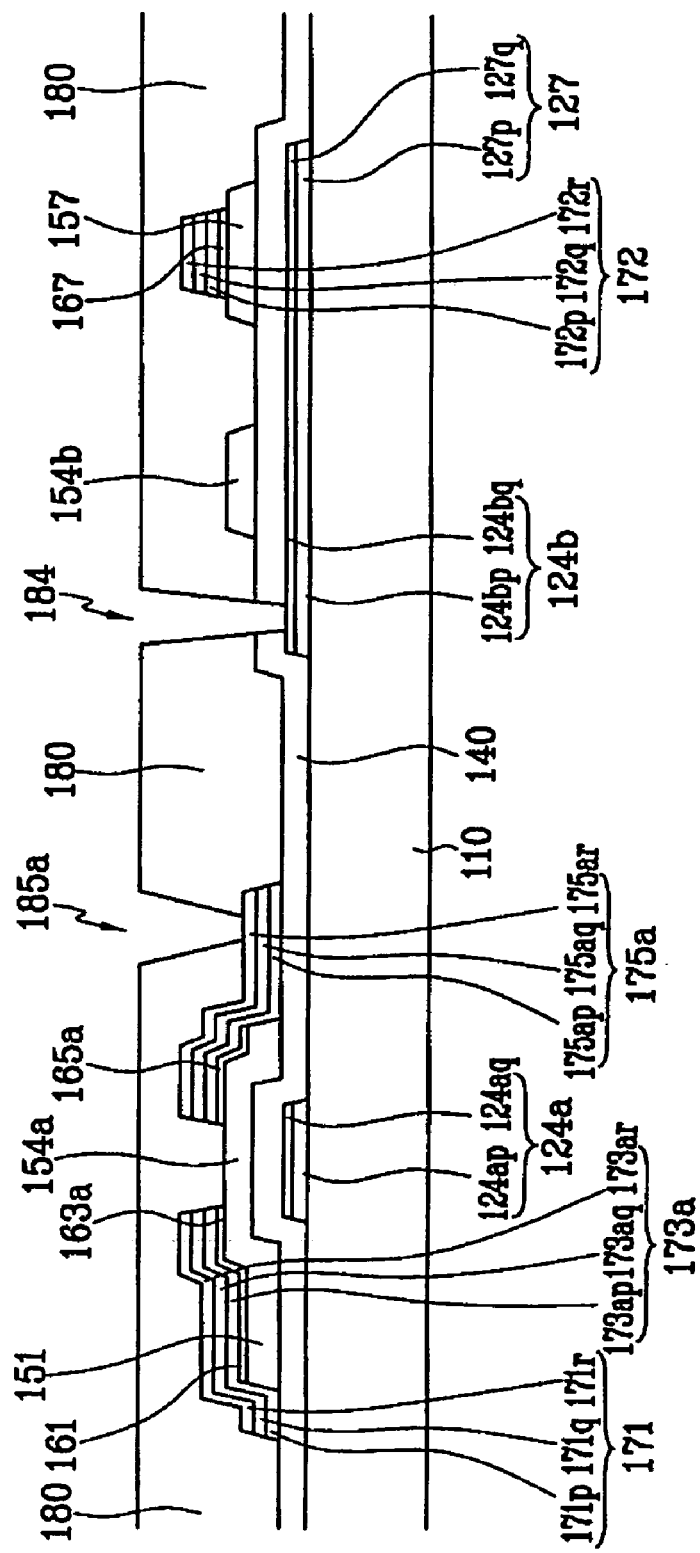
FIGS. 12A and 12B are sectional views of the OLED display shown in FIG. 11 taken along the lines XIIA-XIIA' and XIIB-XIIB', respectively.
Figure 12B:
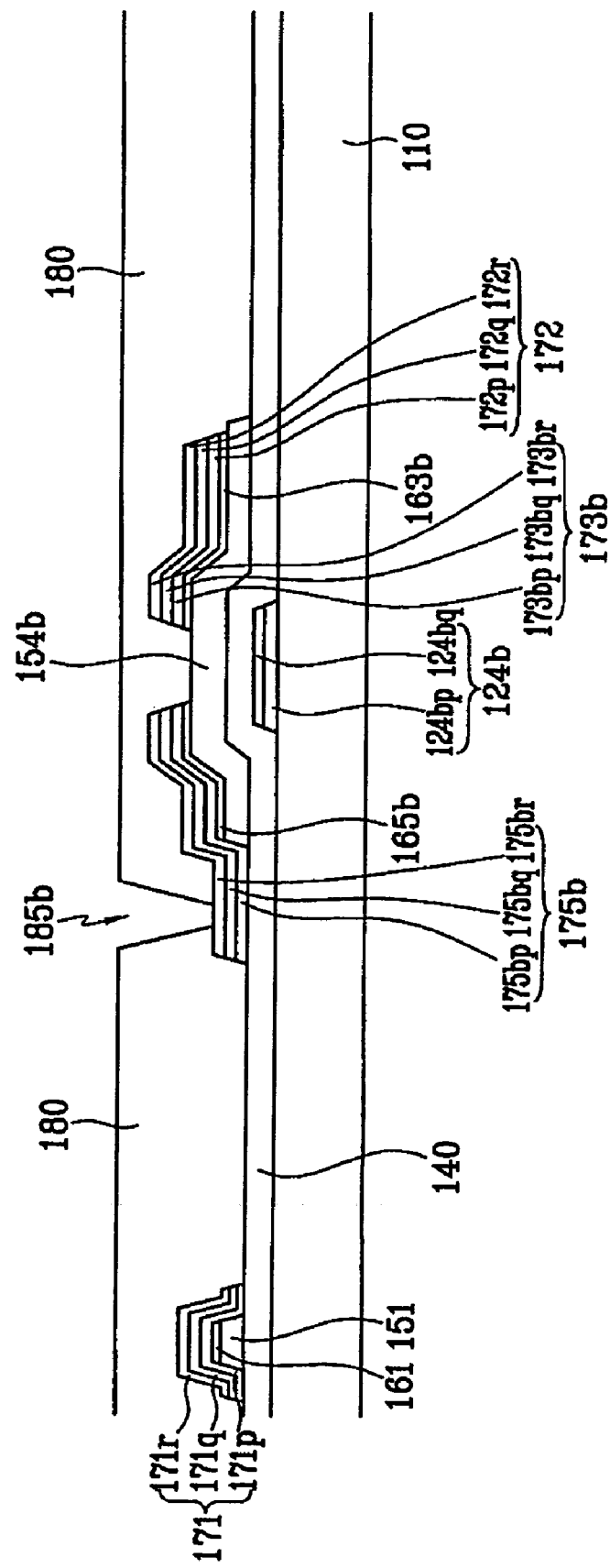

Referring to FIGS. 11-12B, a passivation layer 180 is deposited and patterned by lithography and etching to form a plurality of contact holes 181, 182, 184, 185a and 185b exposing the end portions 129 of the gate lines 121, the end portions 179 of the data lines 171, the second gate electrodes 124b, the first drain electrodes 175a, and the second drain electrodes 175b, respectively.

Figure 13:
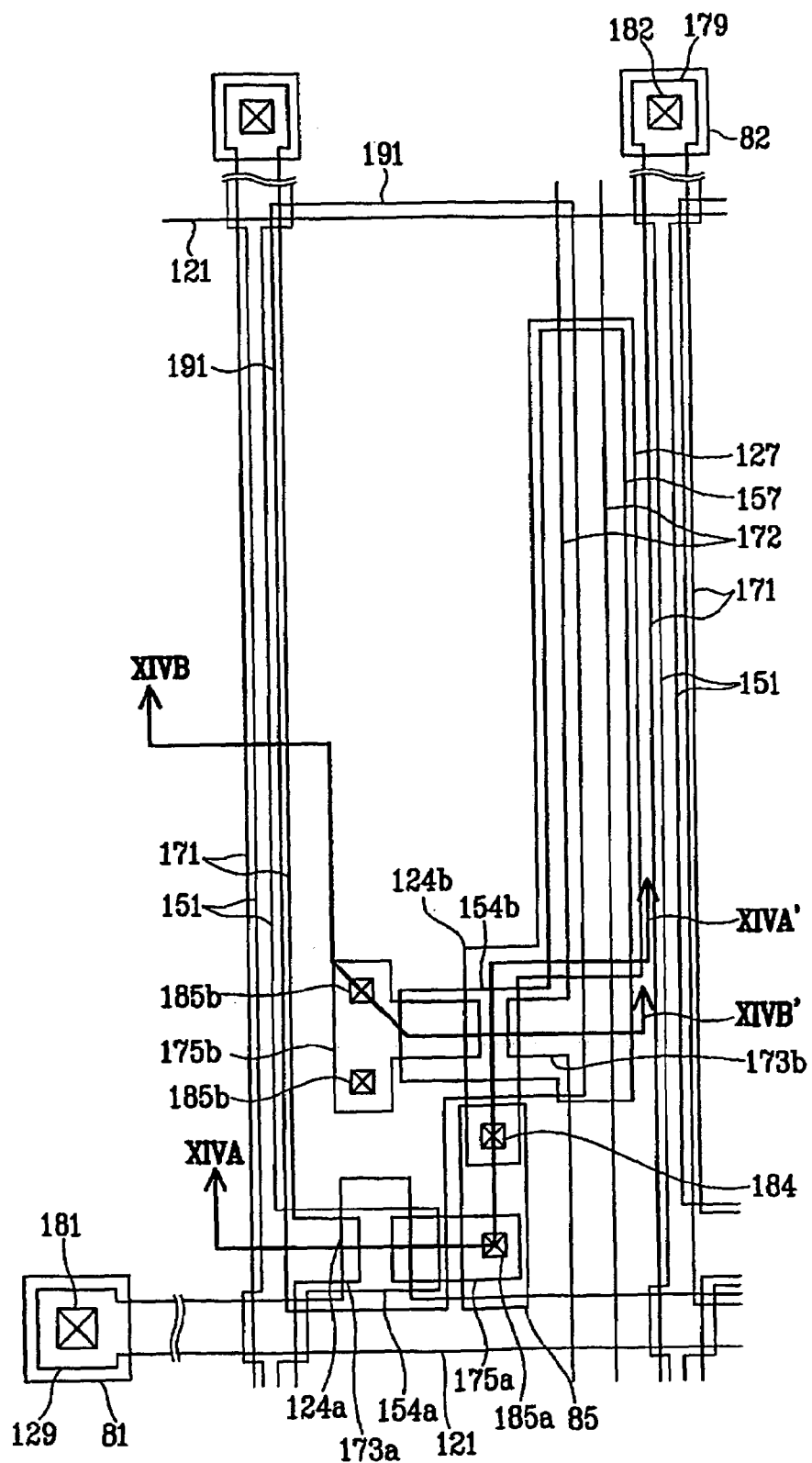
Figure 14A:
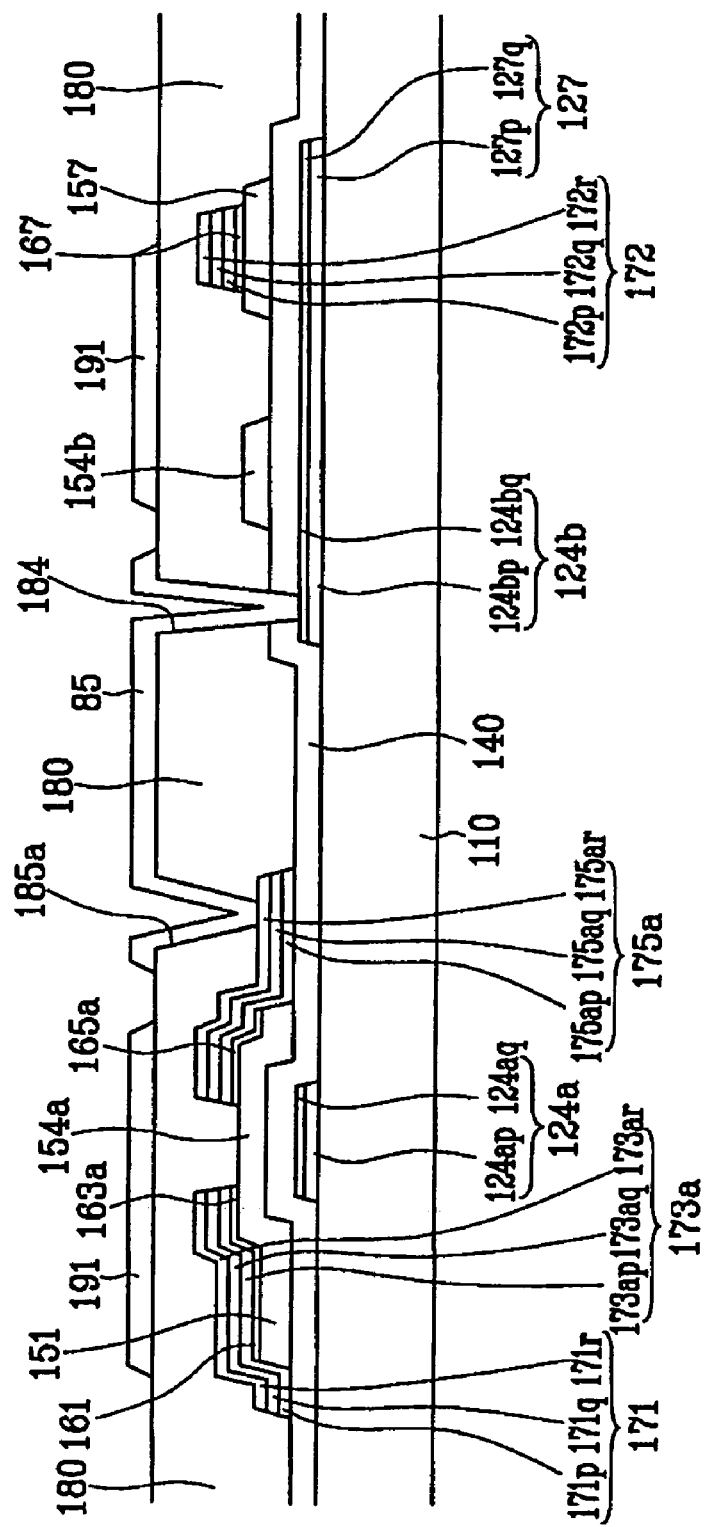
FIGS. 14A and 14B are sectional views of the OLED display shown in FIG. 13 taken along the lines XIVA-XIVA' and XIVB-XIVB', respectively.
Figure 14B:
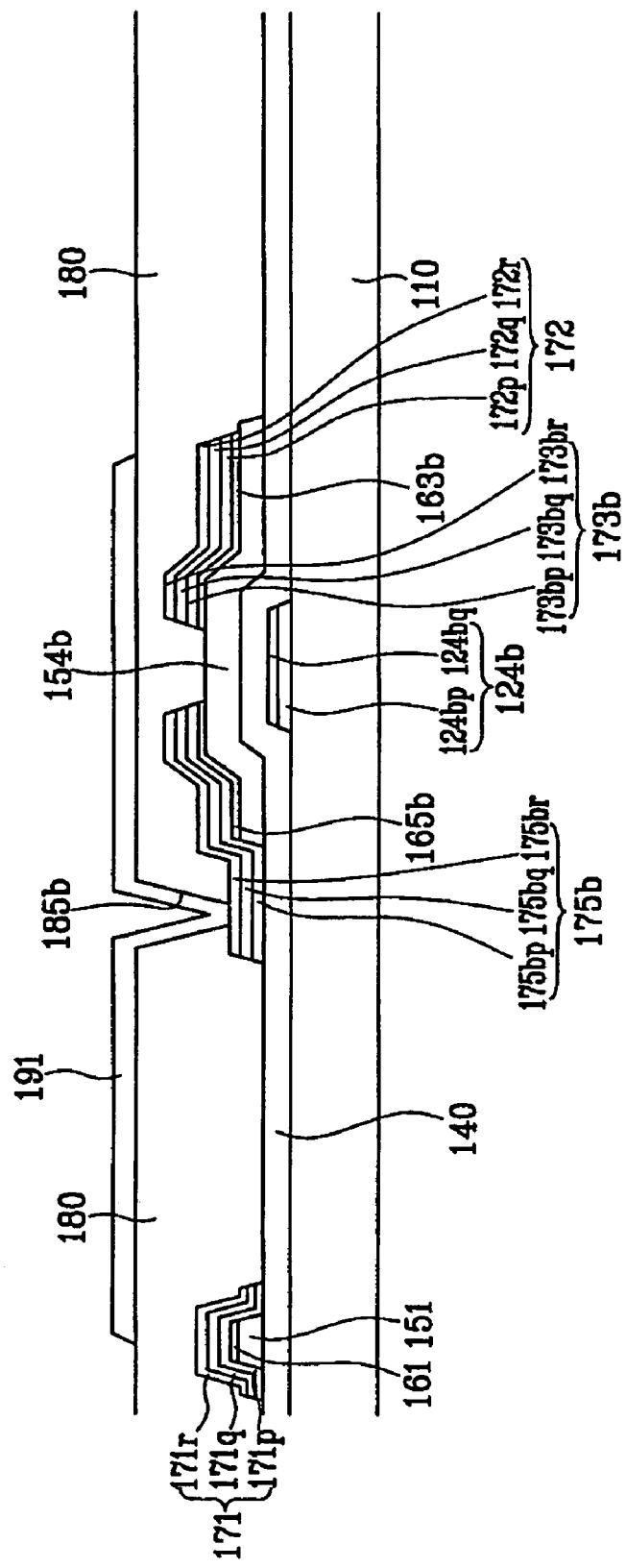
Figure 15A:
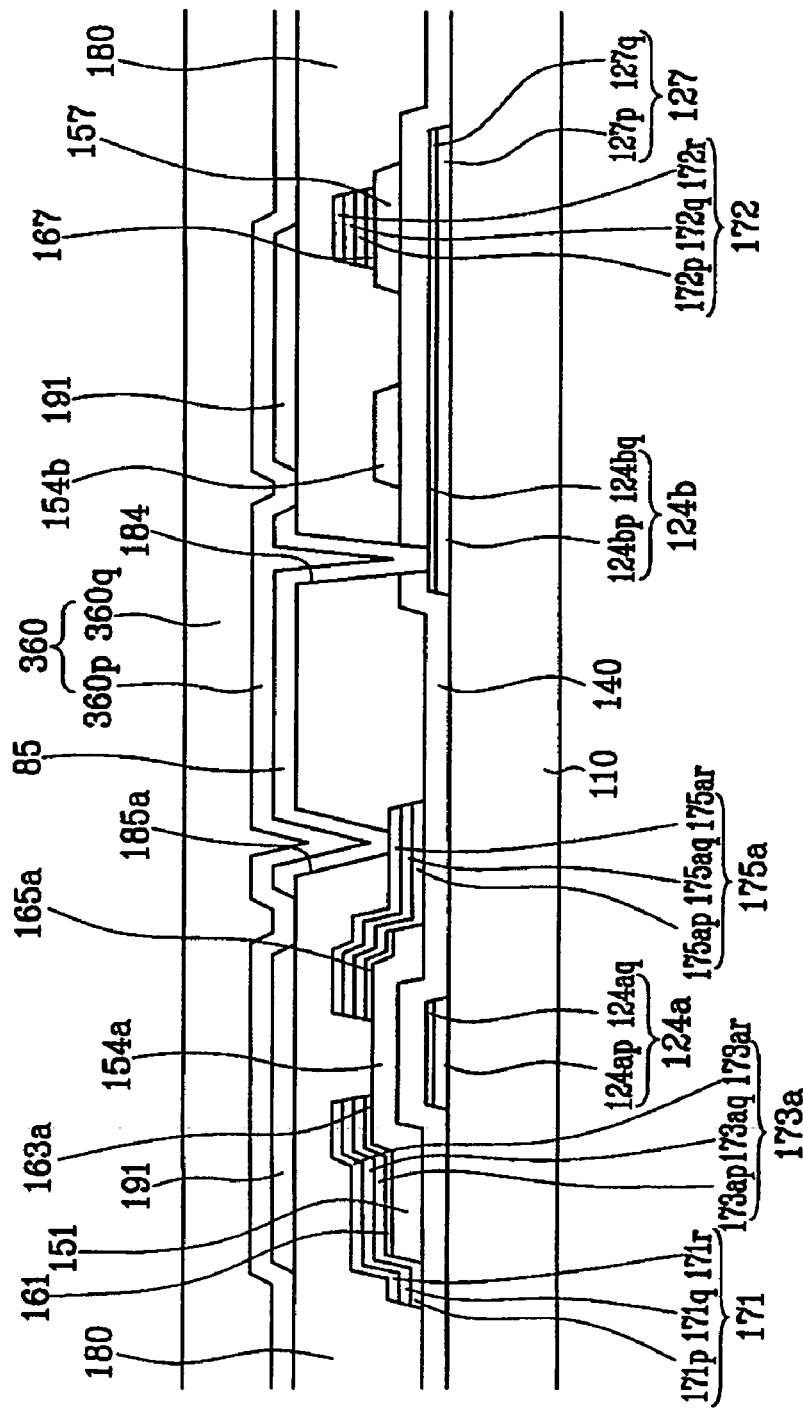
FIGS. 15A and 15B are sectional views of the OLED display shown in FIG. 13 taken along the lines XIVA-XIVA' and XIVB-XIVB', respectively, which illustrating the step following the step shown in FIGS. 14A and 14B.
Figure 15B:
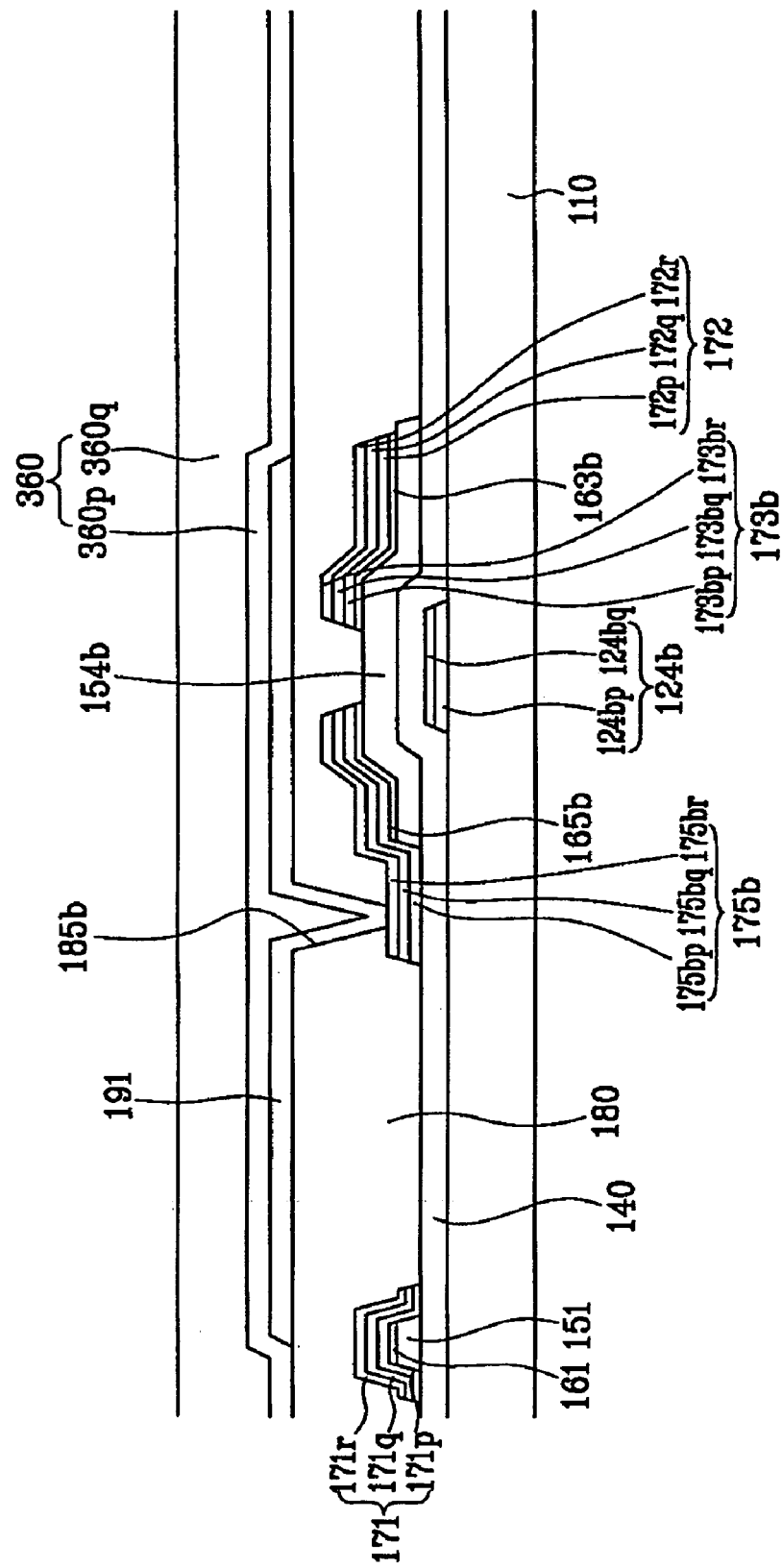

Referring to FIGS. 13-14B, a plurality of pixel electrodes 191, a plurality of connecting members 85, and a plurality of contact assistants 81 and 82 are formed on the passivation layer 180.

Referring to FIGS. 15A and 15B, a lower partition film 360p, which may be made of an organic or inorganic insulator, and an upper partition film 360q, which may be made of a photosensitive organic insulator, are deposited in sequence.

Figure 16A:
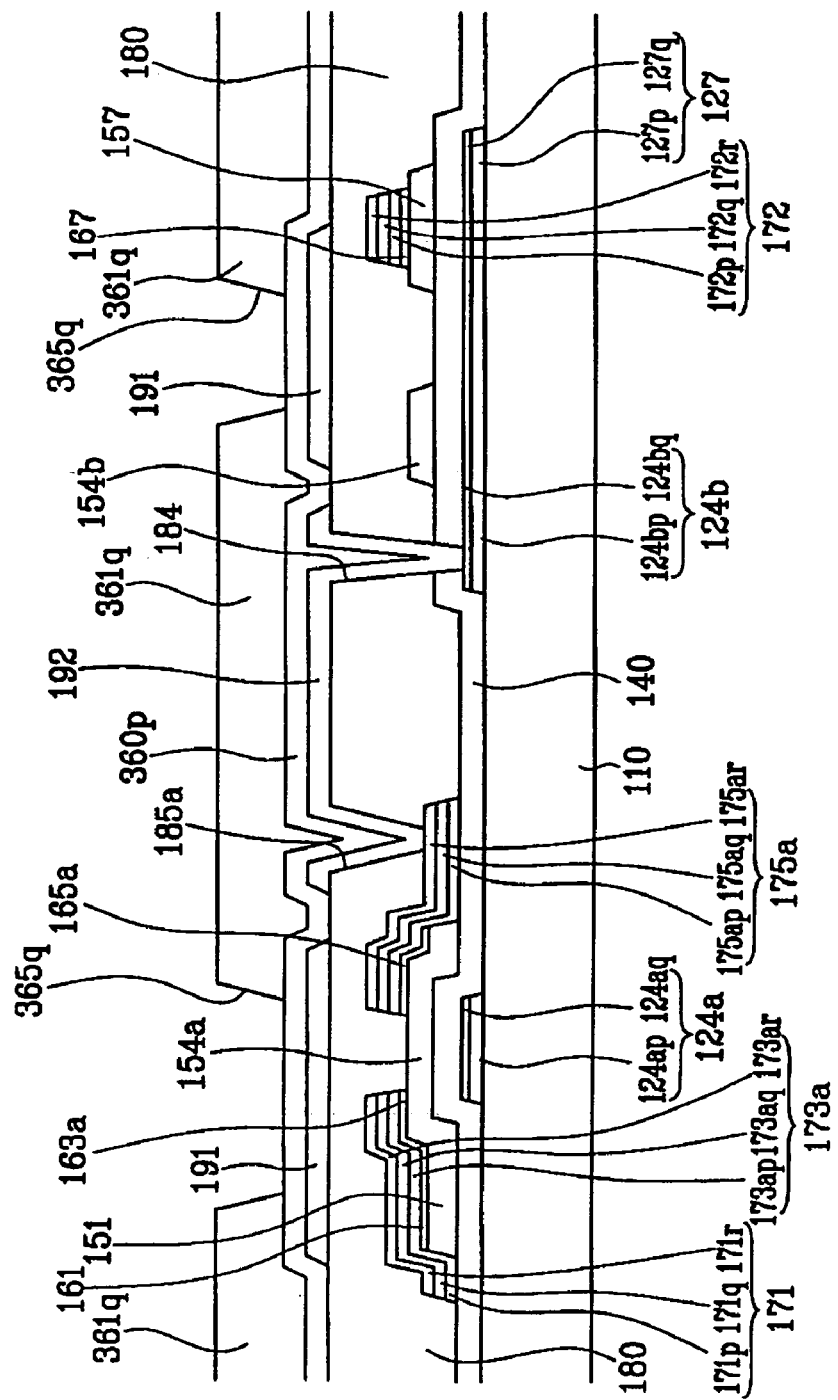
FIGS. 16A and 16B are sectional views of the OLED display shown in FIG. 13 taken along the lines XIVA-XIVA' and XIVB-XIVB', respectively, which illustrating the step following the step shown in FIGS. 15A and 15B.
Figure 16B:
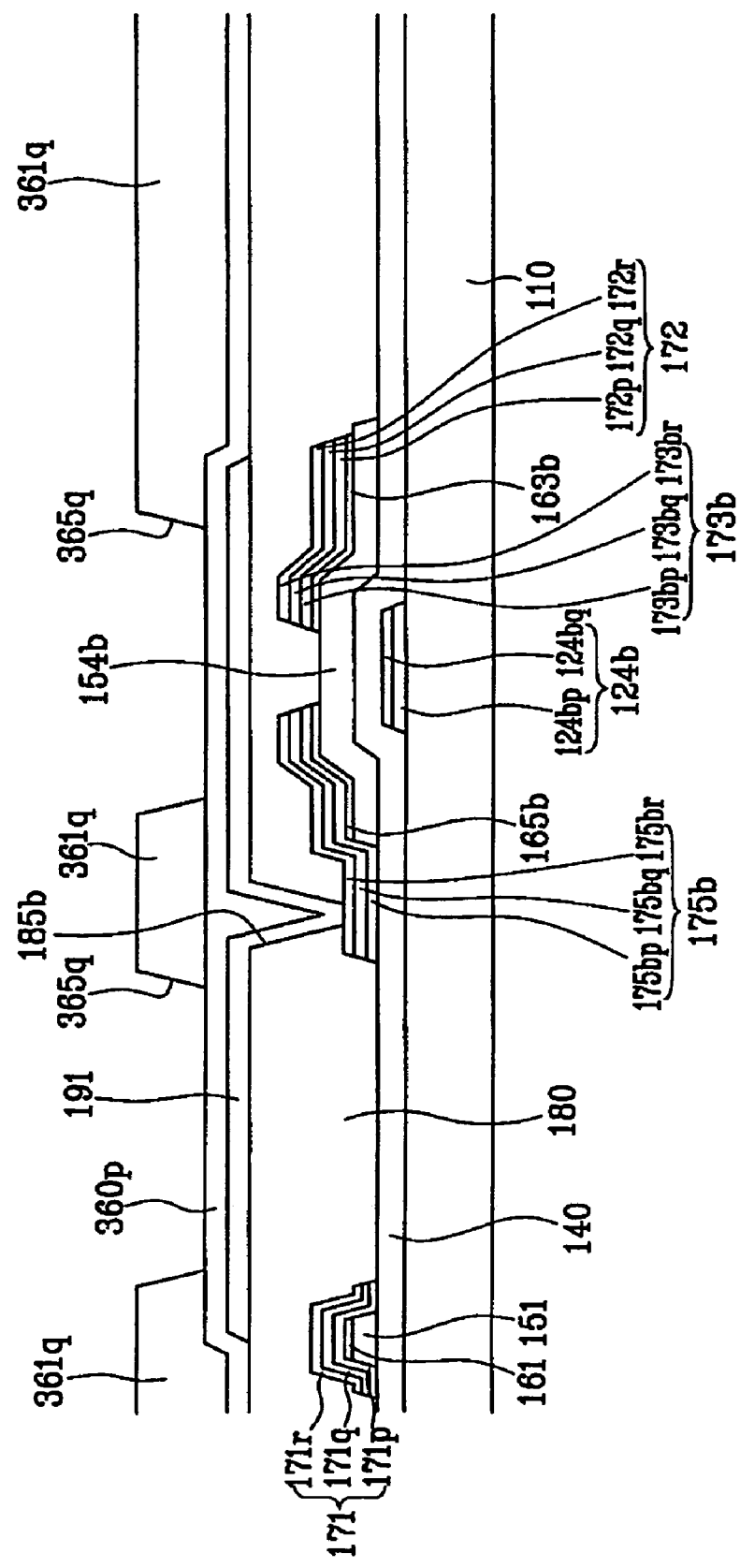

Referring to FIGS. 16A and 16B, the upper partition film 360q is exposed to light through a mask (not shown) and developed to form an upper partition 361q having upper openings 365q on the pixel electrodes 191.

Figure 17:
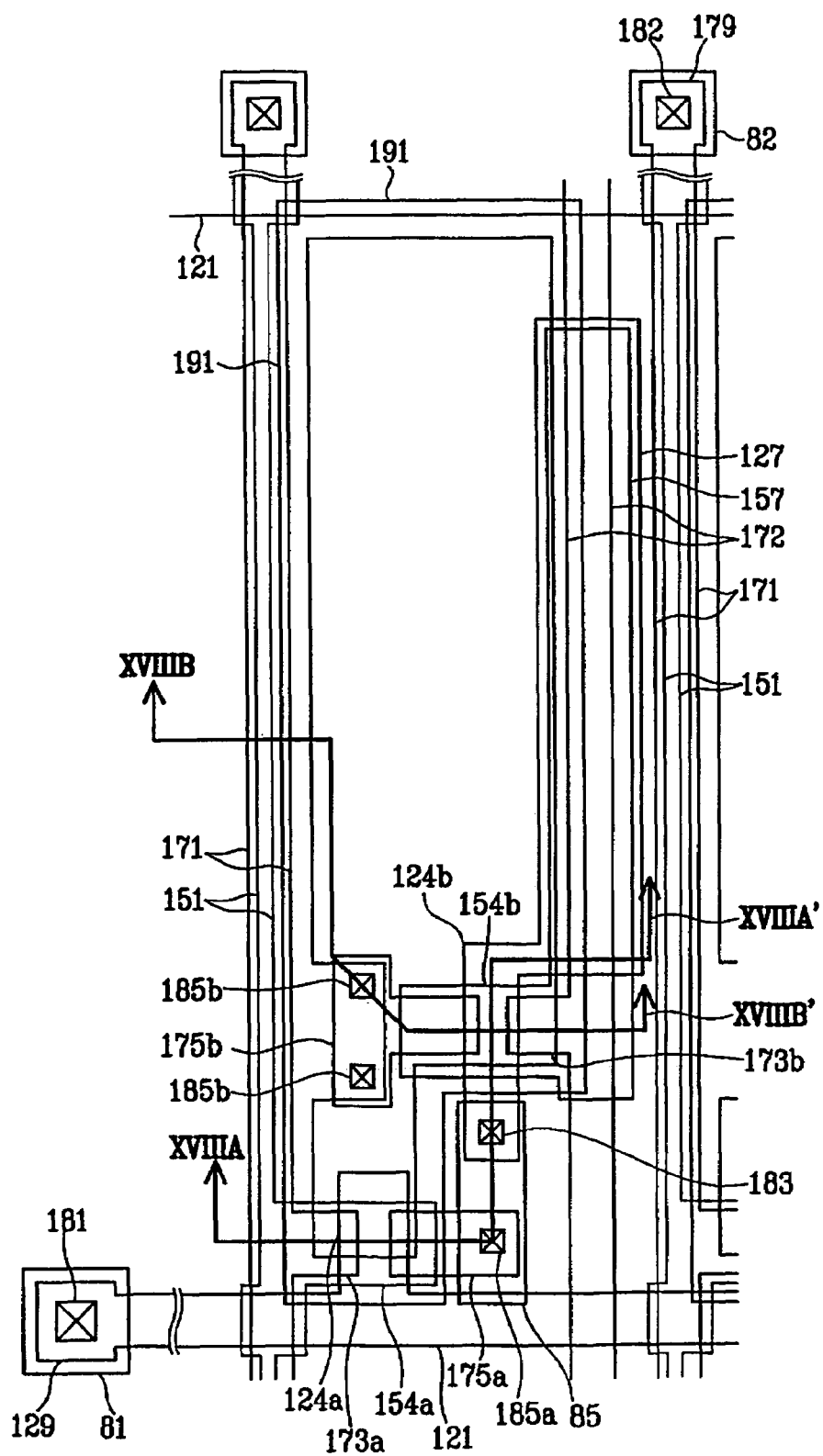
Figure 18A:
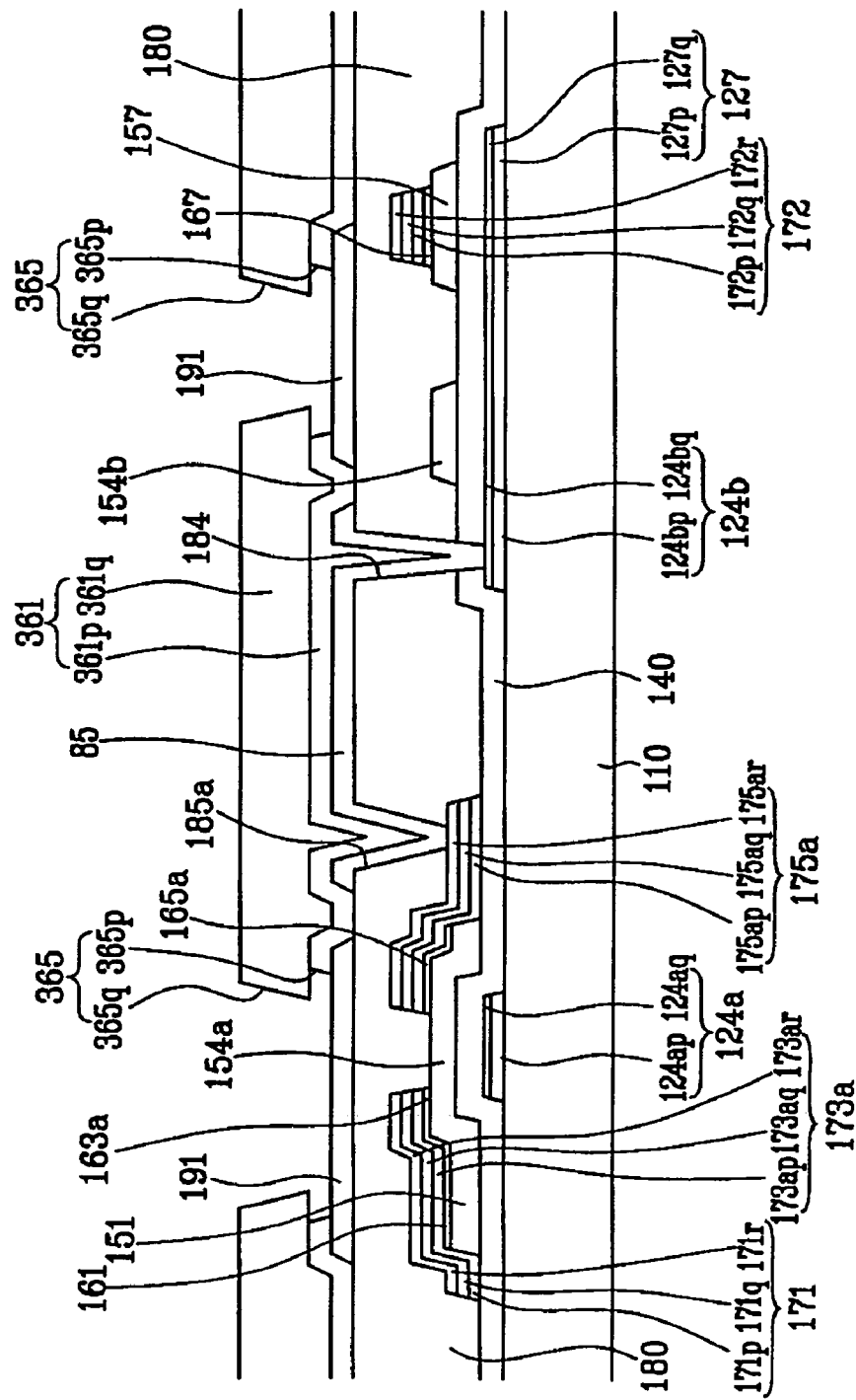

Referring to FIGS. 17-18B, the lower partition film 360p is etched using the upper partition 361q as an etch mask to form a lower partition 361p having lower openings 365p exposing the pixel electrodes 191. The etching in this step may be any of wet etching and dry etching and it is preferable that the etching condition is selected to isotropically etch the lower partition film 360p, thereby removing lateral surfaces of the lower partition film 360. Although FIGS. 18A and 18B show that the lower partition 360q has a positive gradient, it may have vertical or negatively inclined lateral surfaces.

As a result, a plurality of openings 365, each including a lower opening 365p and an upper opening 365q that is smaller than the lower opening 365p, are completed.

Figure 19:
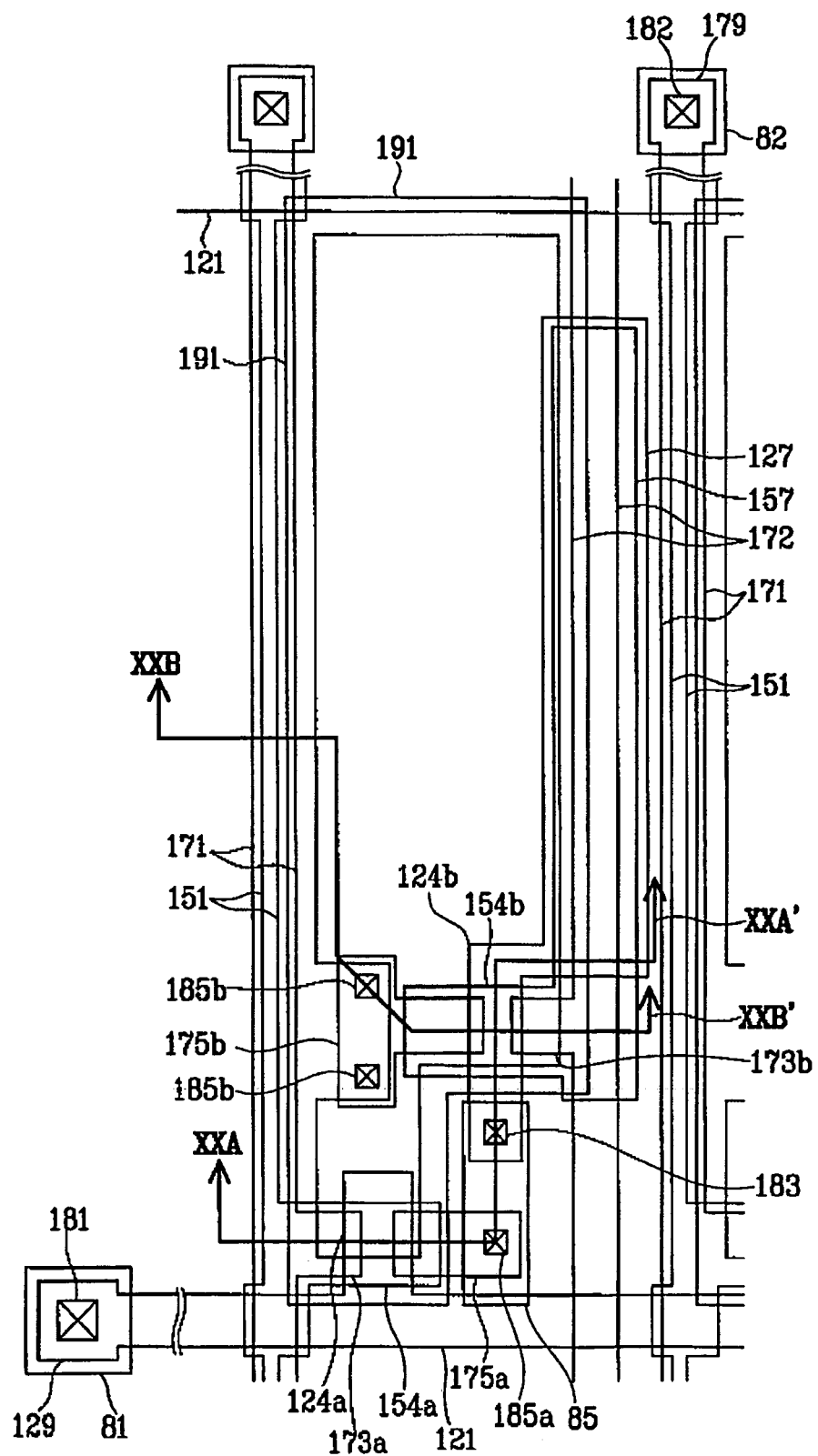
Figure 20A:
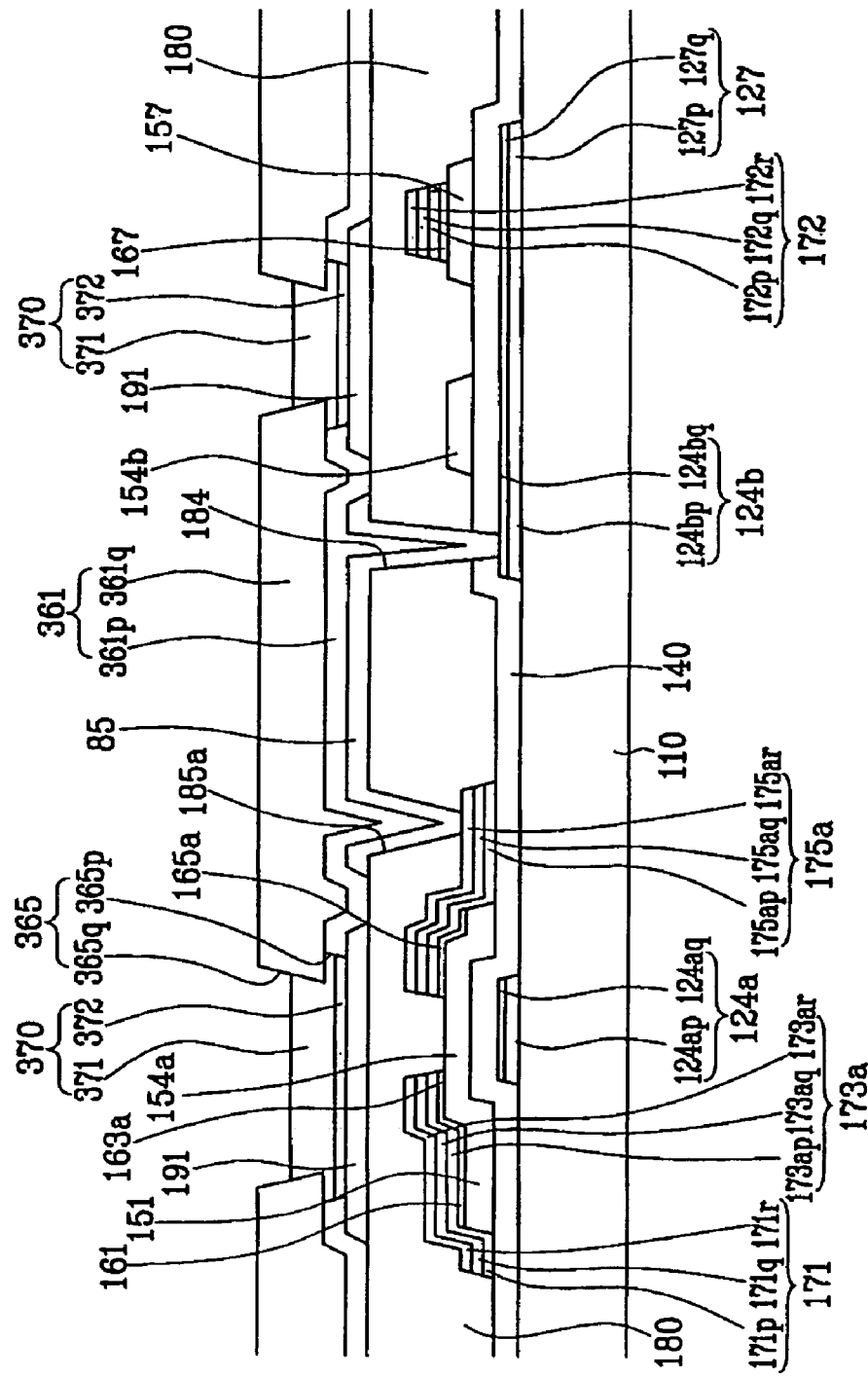
FIGS. 20A and 20B are sectional views of the OLED display shown in FIG. 19 taken along the lines XXA-XXA' and XXB-XXB', respectively.
Figure 20B:
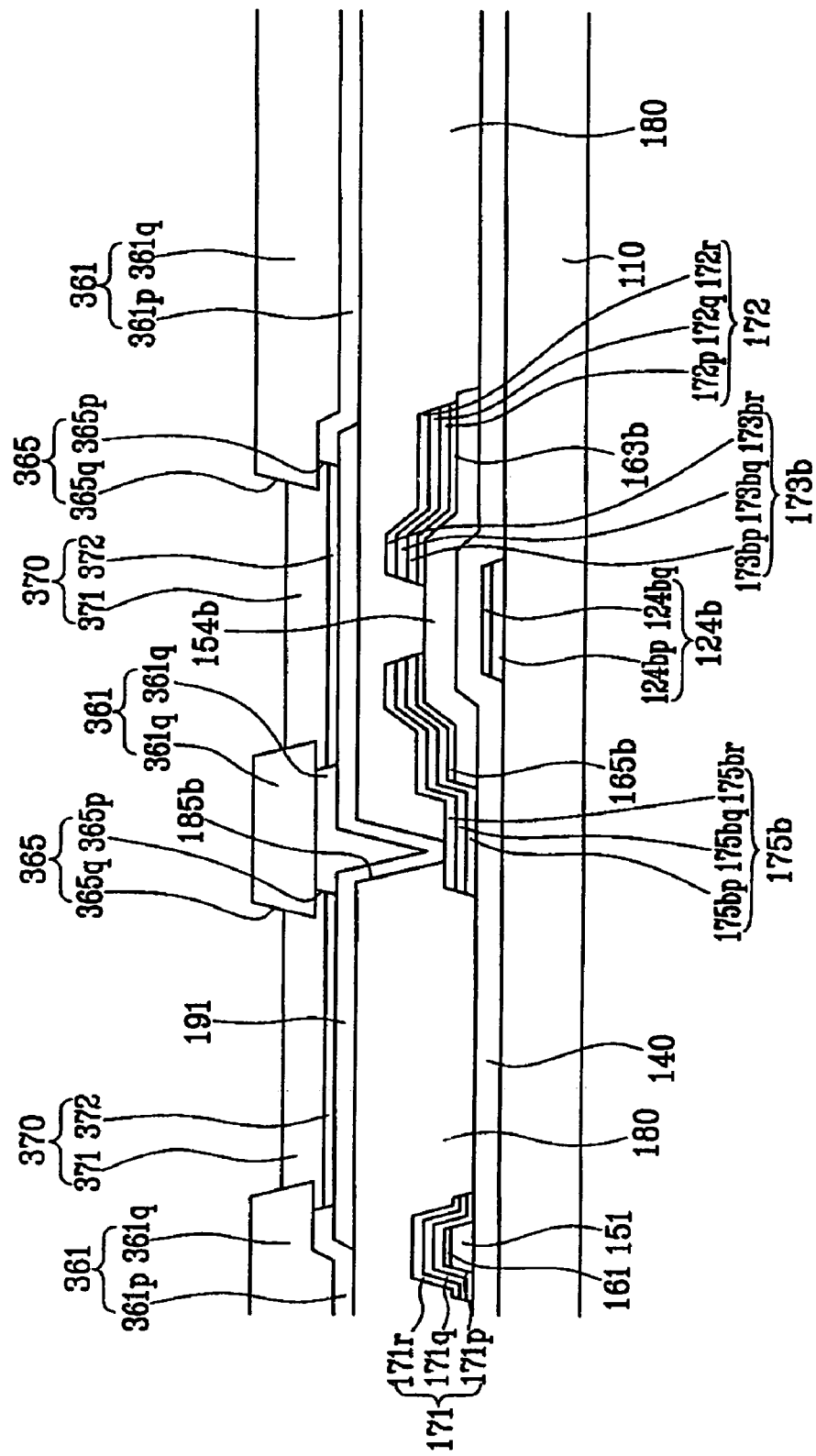

Referring to FIGS. 19-20B, a plurality of hole transport layers 372, which are thinner than the lower partition 361p, are formed in the openings 365 disposed on the pixel electrodes 191. The formation of the hole transport layers 372 may be performed by inkjet printing that drops a solvent solution into the openings 365 with a moving inkjet head (not shown), and in this case, a drying step for removing the solvent follows.

Referring to FIGS. 2-3B, a plurality of emitting layers 371 are formed on the hole transport layers 372 preferably by inkjet printing. Finally, a common electrode 270 is formed on the emitting layers 371 and the upper partitions 361q.

The invention thus improves the uniformity of the light emission and prevents the decrease of emissive efficiency due to the current leakage.

The invention may also be employed as a simple matrix OLED display.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display, comprising:
a substrate;
a first electrode disposed on the substrate;
a first partition disposed on the first electrode and having an opening exposing the first electrode;
a second partition disposed an the first partition, the second partition being wider than the first partition, defining an emission area, and comprising photosensitive organic material;
an emission layer disposed in the emission area;
a charge transport layer disposed under the emission layer and including a portion positioned under the first partition; and
a second electrode disposed on the emission layer.

2. The organic light emitting display of claim 1, wherein the charge transport layer is not thicker than the first partition.

3. The organic light emitting display of claim 1, wherein the charge transport layer is wider than the emission area.

4. The organic light emitting display of claim 1, wherein the first partition comprises an organic or an inorganic material.

5. The organic light emitting display of claim 1, wherein a photosensitivity of the second partition is positive.

6. The organic light emitting display of claim 1, further comprising:
a gate line disposed on the substrate;
a data line crossing the gate line; a first transistor coupled to the gate line and the data line;
a second transistor coupled to the first electrode; and
a voltage line coupled to the second transistor.

7. The organic light emitting display of claim 6, wherein the first transistor and the second transistor comprise at least one of polysilicon and amorphous silicon.

8. An organic light emitting display, comprising:
a substrate;
a first electrode disposed on the substrate;
a first partition disposed on the first electrode and having an opening exposing the first electrode;
a second partition disposed on the first partition, the second partition being wider than the first partition, defining an emission area, and comprising photosensitive organic material;
an emission layer disposed in the emission area;
a charge transport layer disposed under the emission layer; and
a second electrode disposed on the emission layer, wherein a total thickness of the charge transport layer, the emission layer, and the second electrode is larger than a thickness of the first partition.

9. A method of manufacturing an organic light emitting display, the method comprising:
forming a first electrode on a substrate;
depositing an insulating layer on the first electrode;
depositing a photosensitive organic layer on the insulating layer;
light-exposing and developing the photosensitive organic layer to form an upper partition;
etching the insulating layer using the upper partition as an etch mask to form a lower partition having an opening exposing the first electrode;
forming a charge transport layer in the opening and extending at least partially under the lower partition;
forming an emission layer in the opening; and
forming a second electrode on the emission layer.

10. The method of claim 9, wherein etching the insulating layer comprises isotropic etching.

11. The method of claim 9, wherein the lower partition is narrower than the upper partition.

12. The method of claim 9, wherein etching the insulating layer comprises a substantially isotropic wet etch or dry etch.

13. The method of claim 9, wherein depositing the photosensitive organic layer comprises spin coating.

14. The method of claim 9, wherein forming the emission layer comprises inkjet printing.

15. The method of claim 9, further comprising:
    forming the charge transport layer in the opening before forming the emission layer.

16. The method of claim 15, wherein the charge transport layer is not thicker than the lower partition.

17. The method of claim 15, wherein a total thickness of the charge transport layer, the emission layer, and the second electrode is larger than a thickness of the lower partition.

18. The method of claim 9, further comprising: forming a gate line, a data line, a switching transistor, and a driving transistor before forming the first electrode.

19. The method of claim 18, wherein the first electrode is coupled to the driving transistor.

* * * * *